US008073169B2

(12) United States Patent
Rosen

(10) Patent No.: US 8,073,169 B2
(45) Date of Patent: *Dec. 6, 2011

(54) CONTROLLING FADING AND SURROUND SIGNAL LEVEL

(75) Inventor: Michael D. Rosen, Weston, MA (US)

(73) Assignee: Bose Corporation, Framingham, MA (US)

( * ) Notice: Subject to any disclaimer, the term of this patent is extended or adjusted under 35 U.S.C. 154(b) by 1070 days.

This patent is subject to a terminal disclaimer.

(21) Appl. No.: 11/932,497

(22) Filed: Oct. 31, 2007

(65) Prior Publication Data

US 2008/0107293 A1 May 8, 2008

Related U.S. Application Data

(63) Continuation of application No. 11/071,935, filed on Mar. 4, 2005, now abandoned, which is a continuation-in-part of application No. 10/367,251, filed on Feb. 14, 2003, now Pat. No. 7,305,097.

(51) Int. Cl.

| | |
|---|---|
| ***H04R 5/02*** | (2006.01) |
| ***H04R 5/00*** | (2006.01) |
| ***H04B 1/00*** | (2006.01) |
| ***H03G 3/00*** | (2006.01) |
| ***G10H 1/08*** | (2006.01) |

(52) U.S. Cl. .......... 381/307; 381/119; 381/306; 381/61; 381/18; 84/625; 84/660

(58) Field of Classification Search .................. 381/119, 381/59, 123, 17–19, 1, 300–309, 102–109; 84/625, 660, 697

See application file for complete search history.

(56) References Cited

U.S. PATENT DOCUMENTS

| | | | |
|---|---|---|---|
| 3,702,901 | A | 11/1972 | Cherry |
| 4,682,364 | A | 7/1987 | Dunnebacke |
| 4,953,213 | A | 8/1990 | Tasaki et al. |
| 5,068,897 | A | 11/1991 | Yamato et al. |
| 5,073,944 | A | 12/1991 | Hirasa |
| 5,122,720 | A | 6/1992 | Martinson |
| 5,212,733 | A | 5/1993 | DeVitt et al. |
| 5,513,268 | A | 4/1996 | Birona et al. |
| 5,530,760 | A | 6/1996 | Paisley et al. |
| 5,812,688 | A | 9/1998 | Gibson |
| 6,154,549 | A | 11/2000 | Arnold |

(Continued)

FOREIGN PATENT DOCUMENTS

EP 0352627 1/1990

(Continued)

OTHER PUBLICATIONS

Examination Report, issued in corresponding European Application Serial No. 06110452.7, dated Feb. 28, 2008.

(Continued)

*Primary Examiner* — Devona Faulk

(57) ABSTRACT

Preserving an audio signal in an audio system includes selecting a first audio signal from a plurality of audio signals. The first audio signal is applied to a first transducer. Mix a portion of the first audio signal with a second audio signal from the plurality of audio signals to provide a mixed audio signal. A gain of the first audio signal that is applied to the first transducer is decreased while a portion of the mixed audio signal is applied to a second transducer to preserve at least a portion of the first audio signal.

7 Claims, 15 Drawing Sheets

U.S. PATENT DOCUMENTS

| | | | | |
|---|---|---|---|---|
| 6,167,140 | A | 12/2000 | Watanabe | |
| 6,813,361 | B1 | 11/2004 | Jeffs | |
| 6,977,653 | B1 | 12/2005 | Cleary et al. | |
| 7,110,550 | B2 | 9/2006 | Motojima et al. | |
| 7,305,097 | B2 * | 12/2007 | Rosen et al. | 381/307 |
| 2001/0022841 | A1 * | 9/2001 | Motojima et al. | 381/27 |
| 2002/0031236 | A1 * | 3/2002 | Shimizu et al. | 381/104 |
| 2002/0131611 | A1 | 9/2002 | Hoover et al. | |
| 2002/0181718 | A1 | 12/2002 | Kato et al. | |
| 2003/0076966 | A1 | 4/2003 | Okabayashi | |

FOREIGN PATENT DOCUMENTS

| | | | |
|---|---|---|---|
| EP | 1469705 | | 10/2004 |
| JP | 2001025098 | A | 1/2001 |
| WO | 9119407 | A1 | 12/1991 |
| WO | WO 9911100 | | 3/1999 |

OTHER PUBLICATIONS

European Search Report, issued in corresponding European Application Serial No. 06110452.7, dated Jun. 21, 2007.

Japan Office Action dated Mar. 2, 2010 for Application No. 2004-38766.

China Office Action for Application No. 200410005042.0 dated May 22, 2009.

Japan Office Action dated May 26, 2009 for Application No. 2004-38766.

Japan Office Action dated Dec. 9, 2008 for Application No. 2004-38766.

Japanese Notice Allowance dated Aug. 24, 2010 for Application No. 2004-038766, 4 pages.

Granted Claims for Japanese Application No. 2004-038766, allowed Aug. 24, 2010, 4 pages.

Japanese Office Action dated Sep. 21, 2010, for App. No. 2006-058541, 5 pages. Japanese and English Translation.

Communication from European Patent Office in counterpart application (04100252.8) dated Aug. 31, 2007, 3 pages.

European Search Report dated Jun. 21, 2007, issued in European Application No. 06110152.7, filed Feb. 27, 2006.

Office Action dated Dec. 9, 2008 received in corresponding Japanese application No. 2004-038766.

Examination Report dated Dec. 23, 2008 received in corresponding European application No. 06110452.7.

* cited by examiner

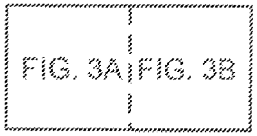

FIG. 3

CONTROL POSITION 255

250

| 1 | 2 | 3 | 4 | 5 | 6 | 7 | 8 |
|---|---|---|---|---|---|---|---|
| 280<br>FL=0 dB<br>SL=-1.5 dB | FL=0 dB<br>SL=-1.5 dB | 285-1<br>FL=0 dB<br>SL=-3 dB | FL=0 dB<br>SL=-6 dB | FL=0 dB | FL=0 dB | FL=0 dB | FL=0 dB |
| FR=0 dB<br>SR=-1.5 dB | FR=0 dB<br>SR=-1.5 dB | FR=0 dB<br>SR=-3 dB | FR=0 dB<br>SR=-6 dB | FR=0 dB | FR=0 dB | FR=0 dB | FR=0 dB |
| C=0 dB | C=0 dB | C=0 dB | C=0 dB | C=0 dB | C=0 dB | C=0 dB | C=0 dB |
| 285-3<br>FL=-60 dB<br>SL=-60 dB | FL=-14 dB<br>SL=-17 dB | 285-2<br>FL=-9 dB<br>SL=-13 dB | FL=-6 dB<br>SL=-9 dB | SL=-5 dB | SL=-3 dB | 288-1<br>SL=-1.5 dB | SL=0 dB |
| 285-4<br>FR=-60 dB<br>SR=-60 dB | FR=-14 dB<br>SR=-17 dB | FR=-9 dB<br>SR=-13 dB | FR=-6 dB<br>SR=-9 dB | SR=-5 dB | SR=-3 dB | 288-2<br>SR=-1.5 dB | SR=0 dB |
| 285-5<br>LFE=0 dB | LFE=0 dB | LFE=0 dB | LFE=0 dB | LFE=0 dB | LFE=0 dB | LFE=0 dB | LFE=0 dB |

FIG. 3A

CONTROL POSITION

| 9 | 10 | 11 | 12 | 13 | 14 | 15 | |
|---|---|---|---|---|---|---|---|
| FL=0 dB | FL=0 dB | FL=0 dB | FL=-4 dB<br>SL=-6 dB | 295-1<br>FL=-8 dB<br>SL=-10 dB | FL=-13 dB<br>SL=-15 dB | 295-3<br>FL=-60 dB<br>SL=-60 dB | 80 FL-T |
| FR=0 dB | FR=0 dB | FR=0 dB | FR=-4 dB<br>SR=-6 dB | FL=-8 dB<br>SL=-10 dB | FR=-13 dB<br>SR=-15 dB | 295-4<br>FR=-60 dB<br>SR=-60 dB | 100 FR-T |
| C=0 dB | C=0 dB | C=0 dB | C=-4 dB | C=-8 dB | C=-15 dB | 295-4<br>C=-60 dB | 90 C-T |
| 287-1<br>SL=1.5 dB | SL=3 dB | SL=5 dB | 290<br>FL=-1.5 dB<br>C=-1.5 dB<br>SL=-1.5 dB | 295-2<br>FL=-1.5 dB<br>C=-1.5 dB<br>SL=-1.5 dB | FL=-1.5 dB<br>C=-1.5 dB<br>SL=-1.5 dB | 295-6<br>FR=0 dB<br>C=0 dB<br>SR=0 dB | 110 SL-T |
| 287-2<br>SL=1.5 dB | SR=3 dB | SR=5 dB | FR=-1.5 dB<br>C=-1.5 dB<br>SR=-1.5 dB | FR=-1.5 dB<br>C=-1.5 dB<br>SR=-1.5 dB | FR=-1.5 dB<br>C=-1.5 dB<br>SR=-1.5 dB | 295-7<br>FR=0 dB<br>C=0 dB<br>SR=0 dB | 130 SR-T |
| LFE=0 dB | LFE=0 dB | LFE=0 dB | LFE=0 dB | LFE=0 dB | LFE=0 dB | LFE=0 dB | 120 LFE-T |

260

FIG. 3B 505 500

FINER CONTROL POSITION IN TRANSITION REGION

| 11 | 1' | 2' | 3' | 12 | |
|---|---|---|---|---|---|
| 600-1<br>FL=0 dB | FL=-1 dB<br>SL=-60 dB | FL=-2 dB<br>SL=-30 dB | FL=-3 dB<br>SL=-10 dB | 600-2<br>FL=-4 dB<br>SL=-6 dB | → FL-S 80 |
| FR=0 dB | FR=-1 dB<br>SR=-60 dB | FR=-2 dB<br>SR=-30 dB | FR=-3 dB<br>SR=-10 dB | FL=-4 dB<br>SL=-6 dB | 510<br>→ FR-S 100 |
| C=0 dB | C=-1 dB | C=-2 dB | C=-3 dB | C=-4 dB | → C-S 90 |
| 610-1<br>SL=5 dB | FL=-60 dB<br>C=-60 dB<br>SL=3 dB | FL=-30 dB<br>C=-30 dB<br>SL=1 dB | FL=-5 dB<br>C=-5 dB<br>SL=0 dB | 610-2<br>FL=-1.5 dB<br>C=-1.5 dB<br>SL=-1.5 dB | → SL-S 110 |
| SR=5 dB | FR=-60 dB<br>C=-60 dB<br>SR=3 dB | FR=-30 dB<br>C=-30 dB<br>SR=1 dB | FR=-5 dB<br>C=-5 dB<br>SR=0 dB | FR=-1.5 dB<br>C=-1.5 dB<br>SR=-1.5 dB | → SR-S 130 |
| LFE=0 dB | LFE=0 dB | LFE=0 dB | LFE=0 dB | LFE=0 dB | → LFE-S 120 |

FIG. 5

800

SIGNAL COEFFICIENTS (WITH MIXING)

| | OUTPUT | 702 L' | 704 R' | 706 C' | 708 $L_s'$ | 710 $R_s'$ | 802 FADE | |
|---|---|---|---|---|---|---|---|---|
| 812 | FL' | a | - | b | - | - | front | 804 |
| 814 | FR' | - | a | b | - | - | front | 804 |
| 816 | FC' | c | c | d | - | - | front | 804 |
| 818 | SL' | e | - | f | g | - | rear | 806 |
| 820 | SR' | - | e | f | - | g | rear | 806 |
| 822 | BC' | h | h | j | k | m | rear | 806 |

FIG. 13

850

SIGNAL COEFFICIENTS (NO MIXING)

| | OUTPUT | 702 L' | 704 R' | 706 C' | 708 $L'_s$ | 710 $R'_s$ | 852 FADE | |
|---|---|---|---|---|---|---|---|---|
| 862 | FL' | a | - | - | - | - | front | 804 |
| 864 | FR' | - | a | - | - | - | front | 804 |
| 866 | FC' | - | - | d | - | - | front | 804 |
| 868 | SL' | - | - | - | g | - | rear | 806 |
| 870 | SR' | - | - | - | - | g | rear | 806 |
| 872 | BC' | - | - | j | - | - | rear | 806 |

FIG. 14

CONTROLLING FADING AND SURROUND SIGNAL LEVEL

CROSS-REFERENCE TO RELATED APPLICATIONS

This patent application is a continuation of and claims the benefit of priority from U.S. application Ser. No. 11/071,935, filed Mar. 4, 2005 now abandoned, which was a continuation-in-part (CIP) of U.S. patent application Ser. No. 10/367,251, filed Feb. 14, 2003 now U.S. Pat. No. 7,305,097, both incorporated here by reference in their entirety This invention relates to audio systems, and more particularly to fading and signal level controls for surround sound audio systems.

BACKGROUND OF THE INVENTION

Audio systems with surround sound features are prevalent in theaters, home entertainment systems, and automobiles. In general, surround sound features enhance the overall listening experience by increasing the aural stimulations associated with music, motion picture soundtracks, and other audio performances. The surround sound capability is provided by using a collection of spatially diverse transducers. Typically, primary (or front) transducers are located in front of the listener or audience and surround sound transducers are located behind and/or to the sides of the listener or audience. Surround sound processing of an audio input controls the signal that is sent to each transducer and causes each transducer to produce a different audio output. As a result, listeners may be presented with the sensation of being seemingly surrounded by sound and/or with the sensation of sound originating from a particular direction.

SUMMARY OF THE INVENTION

In one aspect, systems and methods are described here for providing a single degree of freedom (DOF) control for adjusting multiple audio functions. In particular, a first function may be performed on a first set of signals over a first range of control positions, and one or more other functions may be performed on another set of signals in other ranges of control positions. The number of signals controlled in each range may be different.

In one implementation, a single control device may be used to control both surround signal level and image fader functionality in a surround sound application. The control device performs surround signal level control over a first range of control operation, and performs a fader function over one or more other ranges of control operation. The control device operates only on the surround signal or signals over a portion of an operating range for the control device, and operates on the surround signals and other signals (which may include, e.g., front left, center, and front right signals) over other portions of the operating range. The control device accomplishes both functions in a natural and intuitive manner.

Systems and techniques are provided for using a single control device to control a surround system that includes multiple input signals and multiple spatially diverse transducers. The operating range of the control device may be divided into two or more control regions. Each region may correspond to a different control function. In one implementation, a first control region may control a strength of one or more audio surround source signals relative to one or more audio front source signals. A second control region may control mixing of the audio surround source signals and the audio front source signals in addition to controlling the relative strengths of the audio surround source signals and the audio front source signals. The controlled mixing of the audio surround source signals can be used to preserve one or more of the audio signals in the audio system.

In one aspect, a method for preserving an audio signal in an audio system includes selecting a first audio signal from a plurality of audio signals. The first audio signal is applied to a first transducer. The method also includes mixing a portion of the first audio signal with a second audio signal from the plurality of audio signals to generate a mixed audio signal. A gain of the first audio signal that is applied to the first transducer is decreased while a portion of the mixed audio signal is applied to a second transducer to preserve at least a portion of the first audio signal. Decreasing of the gain of the first audio signal can be achieved by fading-out the first audio signal. Applying the portion of the mixed audio signal to the second transducer can be achieved by fading-in the mixed audio signal.

A gain of the second audio signal can be modified prior to mixing the portion of the first audio signal into the second audio signal. The first audio signal can be a surround sound signal or a center channel signal, for example.

In one example, a portion of a third audio signal from the plurality of audio signals is mixed into a portion of a fourth audio signal from the plurality of audio signals to generate another mixed audio signal. The mixing can include determining mixing coefficients for at least one of the first audio signal and the second audio signal.

In another aspect, an audio system according to the invention includes an audio source that generates a plurality of audio signals. The plurality of audio signals includes a first audio signal that is applied to a first transducer. A processor mixes a portion of the first audio signal with a second audio signal from the plurality of audio signals to generate a mixed audio signal. A fader control decreases a gain of the first audio signal applied to the first transducer while applying a portion of the mixed audio signal to a second transducer to preserve at least a portion of the first audio signal.

The fader control can include a control region having a pure fade function. The processor can be a surround sound processor. The audio source can generate discrete audio signals. One or more of the audio signals can be a surround signal and/or a center channel signal. The fader control can be a rotary control or a linear control.

In another aspect, the invention is embodied in an apparatus for preserving an audio signal in an audio system. The apparatus includes a processor that receives a plurality of audio signals. The processor mixes a portion of a first audio signal from the plurality of audio signals with a second audio signal from the plurality of audio signals to generate a mixed audio signal. A fader control decreases a gain of the first audio signal while increasing a gain of the mixed audio signal to preserve at least a portion of the first audio signal.

The fader control can include a control region having a pure fade function. The processor can include a surround sound processor. One or more of the plurality of audio signals can include a surround signal and/or a center channel signal. The fader control can include a rotary control or a linear control.

In one aspect, the invention is embodied in a fader control. The fader control includes a first control region having a pure fading region. A gain of a first audio signal is decreased in the pure fading region while a gain of a second audio signal is at least preserved. A second control region is located adjacent to the first control region. The gain of the first audio signal is decreased in the second control region while a gain of a first mixed signal is at least preserved. The first mixed signal includes a portion of the first audio signal and a portion of the second audio signal.

At least one of the first and the second audio signals can include a surround signal. At least one of the first and the second audio signals can include a center channel signal. At least one of the first and the second audio signals can include a front channel signal. In one configuration, the first audio signal can include a surround signal and the second audio signal can include a front channel signal.

In another aspect, the invention is embodied in a fader control. The fader control includes a first control region. A gain of a first audio signal is decreased while a gain of a first mixed signal is increased in the first control region. The first mixed signal includes a portion of the first audio signal and a portion of a second audio signal. A second control region is located adjacent to the first control region. Again of a third audio signal is decreased while a gain of a second mixed signal is increased in the second control region. The second mixed signal includes a portion of the third audio signal and a portion of a fourth audio signal.

An additional third control region can be located between the first and the second control region. The third control region provides a pure fading function. A center position of the fader control can be located between the first and the second control region. The center position includes a neutral fading position.

At least one of the first, second, third, and fourth audio signals can include a surround signal. At least one of the first, second, third, and fourth audio signals can include a center channel signal. The first audio signal can include a surround signal and the second audio signal can include a front channel signal. The third audio signal can include a center channel signal and the fourth audio signal can include a surround signal.

In one aspect, the invention is embodied in a method for determining a position of a fader control of an audio system. The method includes calculating a ratio of a front signal to a rear signal generated by the audio system. The method can also include adjusting the position of the fader control and calculating a ratio of a front signal to a rear signal generated by the audio system. The method can also include generating a fade contour by generating a model of fader gain relative to the calculated ratio of the front signal to the rear signal. The method can also include generating a fade contour by generating a look up table of fader gain relative to the calculated ratio of the front signal to the rear signal. The method can also include taking a weighted average of the front signal and the rear signal generated by the audio system.

BRIEF DESCRIPTION OF THE SEVERAL VIEWS OF THE DRAWING

Other features, objects and advantages of this invention may be better understood by referring to the following description in conjunction with the accompanying drawings, where like reference symbols indicate like structural elements and features in which:

FIG. 3 is an illustrative chart of the various input signals and signal levels applied to each transducer for each position of the control device shown in FIG. 2.

FIG. 5 shows an illustrative chart of the various input signals and signal levels applied to each transducer for each intermediate position of the control device shown in FIG. 4.

FIG. 13 is an illustrative signal mixer having signal mixing coefficients for various channels in a surround sound system according to the invention.

FIG. 14 is a signal processor having signal coefficients for various channels in a surround sound system that can be used with the downmix module of FIG. 11.

DETAILED DESCRIPTION

In typical surround sound applications in a vehicle, it is generally useful to be able to fade the audio image between the front and rear of the vehicle, as well as to be able to adjust the relative level of independent signals, such as the level of the surround signals.

Systems and techniques are described here for providing a single degree of freedom (DOF) control for adjusting multiple audio functions. In particular, a first function may be performed on a first set of signals over a first range of control positions, and one or more other functions may be performed on another set of signals in other ranges of control positions. The number of signals controlled in each range may be different.

In one implementation, a single control device may be used to control both surround signal level and image fader functionality in a surround sound application. The control device performs surround signal level control over a first range of control operation, and performs a fader function over one or more other ranges of control operation. The control device operates only on the surround signal or signals over a portion of an operating range for the control device, and operates on the surround signals and other signals (which may include, e.g., front left, center, and front right signals) over other portions of the operating range. The control device accomplishes both functions in a natural and intuitive manner. The disclosed system and techniques will be described and illustrated assuming an automotive listening environment. However, the techniques may be applicable to other types of listening environments, such as a living room, theater, and the like.

The disclosed system and techniques will be described and illustrated assuming an automotive listening environment. However, the techniques may be applicable to other types of listening environments, such as a living room, theater, and the like.

Figure 1:
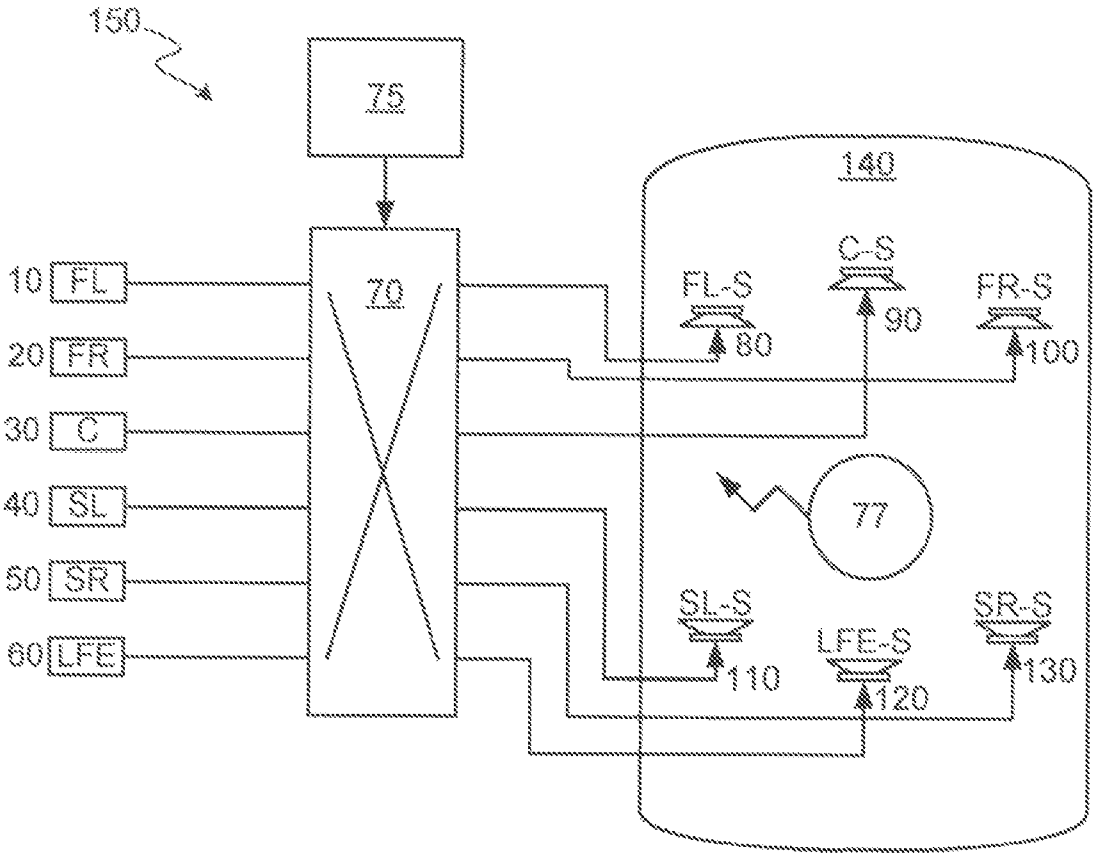
FIG. 1 is a block diagram of a multi-channel discrete surround sound system in an automotive listening environment.

FIG. 1 shows a block diagram of a multi-channel discrete surround sound system in an automotive listening environment. The surround sound system 150 uses a plurality of discrete surround sound source signals corresponding to a front left (FL) channel 10, a front right (FR) channel 20, a center (C) channel 30, a surround left (SL) channel 40, a surround right (SR) channel 50, and a bass or Low Frequency Effects (LFE) channel 60. Although six source signal channels are illustrated and described, the number of source signal channels may vary. For example, the surround sound system 150 may not include a center channel 30 and/or an LFE channel 60. Alternatively, the surround sound system 150 may include a surround center channel (not shown). Thus, the number of source signal channels may be smaller than six or larger than six.

The discrete signals 10-60 are received by a signal processor 70 for operating on the signals 10-60. The signal processor 70 may be implemented in the form of a digital signal processor (DSP) or in analog circuitry. The signal processor 70 performs one or more functions on the various input signals 10-60 to create output signals. One function that may be performed by the signal processor 70 is alteration of signal gain. The signal processor 70 may either attenuate or boost (in either absolute or relative terms) one or more of signals 10-60 based on selected control parameters, as will be described in more detail below.

Another function that may be performed by the signal processor 70 is signal mixing. The signals 10-60 may be mixed together in some fashion within signal processor 70, with variable relative or absolute gain. Signal mixing takes as input a plurality of input signals, mixes together one or more subsets of the input signals, and generates a plurality of output signals. Mixing may include attenuating or boosting the relative level of the input signal subsets to be mixed and summing together the adjusted input signals. Some or all of the output signals may contain components of multiple (i.e., more than one) input signals. The number of input signals may differ from the number of output signals. If the number of output signals is smaller than the number of input signals, the process is referred to as downmixing. If the number of output signals is greater than the number of input signals, the process is referred to as up-mixing.

The signal processor 70 may perform still other functions on the various input signals to create the output signals. For example, the difference between a pair of signals could be taken and output as a signal. The described techniques are not limited in the functions that can be performed on the input signals and are not limited in the number of input signals or output signals that may be present.

After the desired functions have been performed, the output signals from the signal processor 70 may be selectively sent to a plurality of spatially diverse transducers. The transducers may include a front left transducer (FL-T) 80, a center transducer (C-T) 90, a front right transducer (FR-T) 100, a surround left transducer (SL-T) 110, a low frequency effects transducer (LFE-T) 120, and a surround right transducer (SR-T) 130. The various transducers 80-130 may be installed in a vehicle 140. Similar to the number of source signals, the number of transducers can also be smaller than or larger than six.

The values of the control parameters that may be used to adjust the input (source) signals, with or without mixing, may be selected depending on a variety of factors, such as the location of the loudspeakers and whether the purpose of the signal processing is for surround sound level control or image fading control. The control parameters may also depend on the acoustic characteristics of the listening environment.

Figure 2:
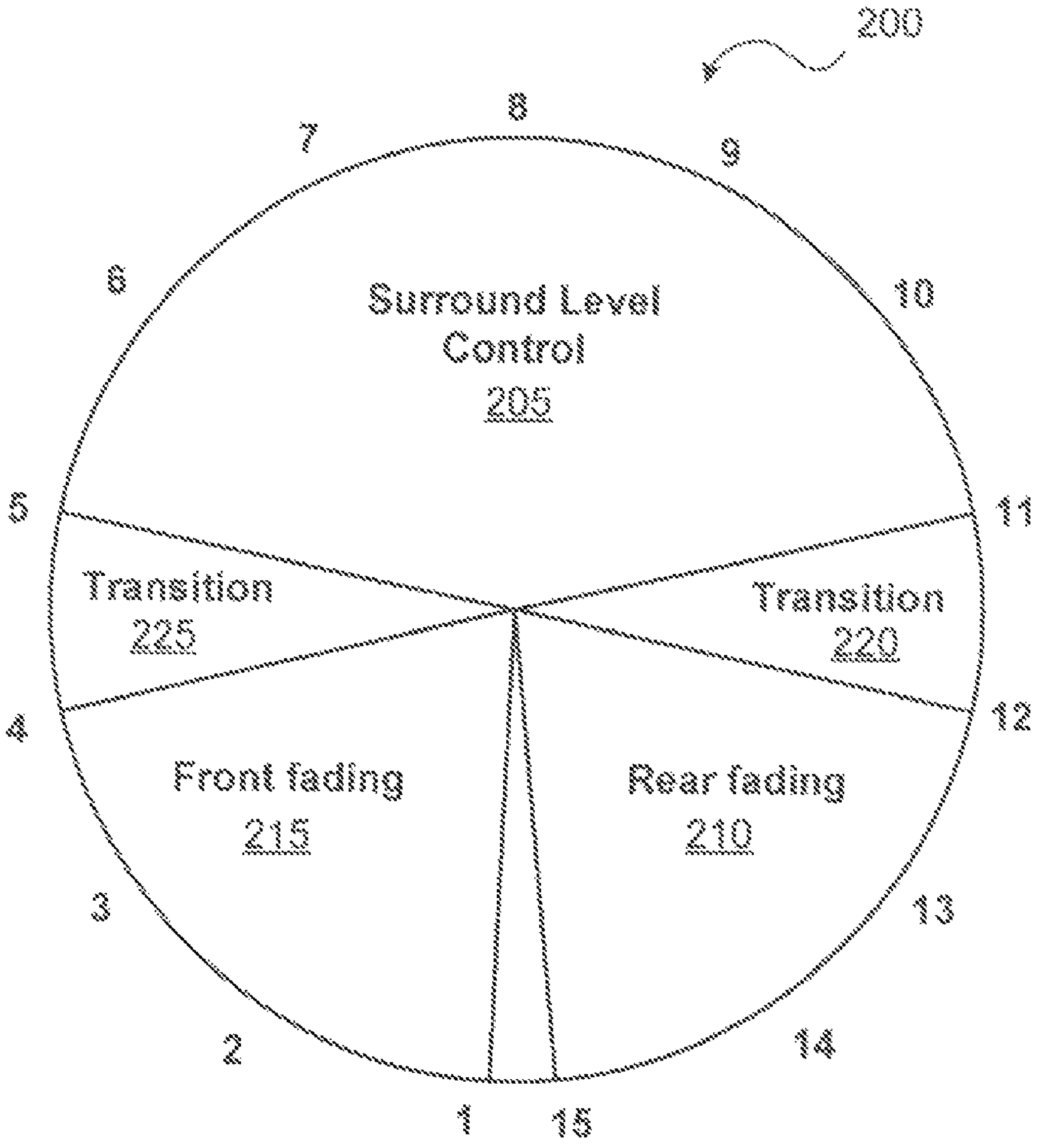
FIG. 2 is a rotary control diagram for a single degree of freedom controller that may be used in a surround sound system.

FIG. 2 shows a rotary control diagram for a single degree of freedom controller that may be used in a surround sound system. The described techniques are not restricted to a rotary control device, however. Other controls such as a slider, or +/− (increment/decrement control) control set, may also be implemented. The control device may include some type of potentiometer for varying an analog signal or control voltage, or may be some type of encoder that outputs a digital code depending on position or actuation of the control device. A digital encoder (which may be rotary, linear, increment/decrement, or some other type of control device) may be used for digital (DSP) implementations.

The control device can be in the form of a remote control or a controller mounted somewhere in the listening environment. The control device may also be located on a component of the surround sound system, such as the control interface unit for a vehicle audio system. For simplicity, the following description assumes use of a rotary control device, although the techniques are equally applicable in connection with other types of control devices.

As illustrated in FIG. 2, the total control region for the rotary control device is divided into a plurality of control regions. In the illustrated implementation, the rotary control device includes five control regions: a surround level control region 205 between positions 5 and 11 clockwise, a rear fading control region 210 between positions 12 and 15 clockwise, a front fading control region 215 between positions 1 and 4 clockwise, a first transition region 220 between positions 11 and 12 clockwise, and a second transition region 225 between positions 4 and 5 clockwise. There are numerous ways to divide the control region, however, and the described techniques are not limited in the manner in which the control regions are divided. For example, the surround sound level control region 205 could be located between positions 4 and 12 clockwise, and front fading and rear fading control regions 210 and 215 could be correspondingly smaller. The control regions could also be divided up asymmetrically, instead of symmetrically as shown in FIG. 2. Greater or fewer numbers of tuning steps (a total of 15 are shown in FIG. 2) may also be used. In some implementations, the number of tuning steps may be sufficiently large that the difference between adjacent tuning steps is virtually imperceptible even when the entire range of tuning steps produces noticeably different audible results. Furthermore, some implementations may not include transition regions 220 and 225 and/or may include only one fading control region.

As an illustrative example, in the surround level control region 205, each clockwise rotation step may increase the surround signal level by 1.5 dB. The surround level control region 205 may simultaneously control a single monophonic surround signal, a stereo pair of surround signals, or multi-channel surround signal levels (e.g., left surround, left center surround, right center surround, and right surround, as might be present in a 7.1 channel implementation). In the example of FIG. 2, a total level change (increase) of 9 dB (6*1.5) could be produced by clockwise rotation of the rotary control device from position 5 to position 11. In one implementation, position 8 may correspond to a 0 db surround level adjustment relative to the original input surround signals, position 11 may correspond to a +4.5 dB adjustment relative to position 8 (each step, such as from positions 8 to 9, increases the level by 1.5 dB), and position 5 may correspond to −4.5 dB adjustment relative to position 8 (each step, such as from positions 8 to 7, decreases the level by 1.5 dB). The step sizes described here are used for illustrative purposes and, in actual implementations, can be varied as desired. Additionally, the level change with each step change need not be constant. The level change when moving from position 8 to position 9 may be different from the level change when moving from position 9 to position 10, and so on.

In the rear fading region 210 between position 12 and position 15, the output level of the front transducers (FL-T 80, FR-T 100, and C-T 90) with respect to the rear transducers (SL-T 110, SR-T 130, and LFE-T 120) may be adjusted for each tuning step. This adjustment may be accomplished by operating on the signals that are applied to the different transducers. A different function may be performed when the control device is actuated over the rear fading region 210 portion of the rotary control device's operating range than is performed in the surround level control region 205 (e.g., over the range from positions 5 to 11). Furthermore, the rear fading control region 210 may control a different set of signals (e.g., levels of more than just surround signals may be adjusted).

For example, clockwise rotation of the control device in the rear fading region 210 may cause the signals fed to the rear transducers to be stronger than the signals fed to the front transducers (i.e., a rear fade function). In addition, the signals fed to the rear transducers may have components of the left front, center, and right front input signals. The signals fed to the front transducers may also contain information from the surround input signals. In some implementations, the signals fed to the front and/or rear transducers may also contain information from the low frequency effects input signals.

There are a variety of possible methods to adjust relative output levels of the front and rear transducers. For each clockwise step of the rotary control in the rear fading scenario, fading can be accomplished by: 1) keeping signals fed to the front transducers unchanged and boosting signals fed to the rear transducers; 2) attenuating signals fed to the front transducers and keeping signals fed to the rear transducers unchanged; 3) attenuating signals fed to the front transducers and boosting signals fed to the rear transducers.

In the front fading region 215 between position 1 and position 4, the output level of the rear transducers (SL-T 110, SR-T 130, and LFE-T 120) with respect to the front transducers (FL-T 80, FR-T 100, and C-T 90) may be adjusted for each tuning step. This adjustment may be accomplished by operating on the signals that are applied to the different transducers. A different function may be performed when the control device is actuated over the front fading region 215 portion of the rotary control device's operating range than is performed in the surround level control region 205 (e.g., over the range from positions 5 to 11) and the rear fading region 210 (e.g., over the range from positions 12 to 15). Furthermore, the front fading control region 215 may control a different set of signals.

For example, counterclockwise rotation of the control device in the front fading region 215 may cause the signals fed to the front transducers to be stronger than the signals fed to the rear transducers (i.e., a front fade function). In addition, the signals fed to the front transducers may have components of the left surround and right surround input signals. The signals fed to the rear transducers may also contain information from the front input signals. In some implementations, the signals fed to the front and/or rear transducers may also contain information from the low frequency effects input signals. The combination of signals may be performed in a different way for operation in the front fading region 215 as compared to operation in the rear fading region 210. For example, operation in the rear fading region 210 may result in signals being fed to the rear transducers that have significant front transducer components, while operation in the front fading region 215 may result in signals being fed to the front transducers that have relatively small surround transducer components.

There are a variety of possible methods to adjust relative output levels of the front and rear transducers. For each counterclockwise step of the rotary control in the front fading scenario, fading can be accomplished by: 1) keeping signals fed to the rear transducers unchanged and boosting signals fed to the front transducers; 2) attenuating signals fed to the rear transducers and keeping signals fed to the front transducers unchanged; 3) attenuating signals fed to the rear transducers and boosting signals fed to the front transducers.

FIG. 3 shows an illustrative control parameter chart 250 of the various input signals and signal levels applied to each transducer for each position of the control device shown in FIG. 2. The control device may be used for a surround sound application in a vehicle, for example. The surround signal level fed to selected transducers is controlled over a first region of operation. Over other regions, various signals are mixed (summed) together using varying relative and absolute levels and then fed to selected transducers. The control parameter chart 250 of FIG. 3 provides the signal mixing and corresponding control parameter values for a six transducer surround sound configuration, as shown in FIG. 1, which uses the rotary control device depicted in FIG. 2. A horizontal axis 255 of the chart 250 represents the control position 1-15 as shown in FIG. 2. A vertical axis 260 of the chart 250 represents the six transducers (FL-T 80, FR-T 100, C-T 90, SL-T 110, SR-T 130, and LFE-T 120), as shown in FIG. 1. The chart 250 represents one possible implementation of a surround level and fading control system. Other signal mixing combinations and parameter values may be used.

Each cell in FIG. 3 shows the discrete signals that are mixed together for each transducer and each control device position. Each cell also shows control parameters that are to be applied to the discrete signals for each transducer and each control device position. The control parameters represent gain changes relative to the original input signals. For example, for the front left transducer 80, when the control is set at position 1 (see FIG. 2), the discrete front left and surround left signals (FL and SL) are processed with particular gain changes, 0 dB and −1.5 dB respectively (as shown in cell 280), and then mixed together (summed). The mixed signal is fed to the front left transducer 80. For the left surround transducer 110, when the control device is set at position 12 (see FIG. 2), discrete front left, center, and surround left signals (FL, C, and SL) are processed with specific gain changes, −1.5 dB each (as shown in cell 290), and then mixed together. The mixed signal is then fed to the left surround transducer 110. The value of the control parameters may be selected in accordance with certain criteria that relate to, for example, optimizing perceived sound quality and/or maintaining a constant overall system output level.

For the surround level control region 205 (between positions 5 and 11 clockwise), the surround input signals and the front input signals are preserved as discrete. That is, no signal mixing takes place, and only gain changes of surround signals relative to the other signals are implemented. When the control device is set at position 8, all of the discrete signals are passed to the corresponding transducer without any gain change. From position 8, every clockwise rotation step increases the surround signal level or levels (SL and SR signals) by a predetermined amount, such as 1.5 dB. At position 9, the left and right surround signals (SL and SR) will have a gain increase of 1.5 dB (see cells 287-1 and 287-2) while other discrete signals are passed through without modifications. Each additional clockwise rotation step results in a further gain increase for the left and right surround signals. In this example implementation, both the left and right surround signals (SL and SR) have a 2 dB gain change when moving from position 10 to position 11. Thus, signal boosts or attenuations provided by each control step need not be constant. The values used in any particular implementation may be selected depending on expected system and listening environment specifications.

Similarly, starting from position 8, every counterclockwise rotation step decreases the left and right surround signal level or levels (SL and SR signals) by a predetermined amount, such as 1.5 dB. In this example, at position 7, the left and right surround signals (SL and SR) have a gain change of −1.5 dB (see cells 288-1 and 288-2) and all other signals are passed through without modification. Additional counterclockwise rotation steps results in a further gain attenuation for the left and right surround signals.

In the rear fading control region 210 (between positions 12 and 15 clockwise), the audio image is faded to the rear with each clockwise step rotation. For operation in this range, the audio signals passed through the signal processing associated with the control device are no longer maintained as discrete. For example, the audio does not represent discrete multi-channel surround sound, but instead input signals are mixed in some manner. However, all of the surround sound information is still present.

From position 12 (see FIG. 2), every clockwise step rotation makes signals fed to the rear transducers 110 and 130 (SL-T and SR-T) relatively stronger than signals fed to the front transducers 80, 90, and 100 (FL-T, FR-T and C-T). Although a particular implementation is illustrated, there are a variety of possible implementations for adjusting relative signal strength between the front transducers and the rear transducers such as: 1) keeping signals fed to the front transducers unchanged and boosting signals fed to the rear transducers; 2) attenuating signals fed to the front transducers and keeping signals fed to the rear transducers unchanged; 3) attenuating signals fed to the front transducers and boosting signals fed to the rear transducers. Any of these methods, alone or in combination, may be used to effect a fade function. The illustrated example keeps the strength of the signals fed to the rear transducers unchanged and decreases the strength of the signals fed to the front transducers, for clockwise step rotations in the region from positions 12 to 15.

In this example, at position 13, the discrete front left signal (FL) is adjusted by being attenuated by 8 dB, the discrete surround left signal (SL) is adjusted by being attenuated by 10 dB, and the two adjusted signals are mixed and fed to the front left transducer 80 (FL-T) (as shown at cell 295-1). In another implementation, the front left and surround left signals (FL and SL) may be attenuated by the same magnitude, such as 8 dB. In such a case, the signals could be mixed together before being attenuated, rather than after. In other words, if the front left and surround left signals (FL and SL) are attenuated by the same magnitude (e.g., 8 dB), the implementation can feed the front left and surround left signals (FL and SL) to the front left transducer (FL-T) without any pre-adjustment. Instead, the output of the front left transducer 80 may be adjusted to achieve the same 8 dB attenuation on both signals FL and SL. Thus, the signal adjustments for a mixing signal scenario can be performed either in the signal processor or in the transducers to which the signals are fed if the adjustment amounts for all the mixed signals are the same. Similarly, the signal adjustments for a discrete signal scenario (such as for the signal fed to the center transducer 90 (C-T)) can be performed either in the signal processor or in the transducers to which the signal is fed.

Different adjustments and mixing are performed at position 13 for the surround transducers as compared to the front transducers. For example, the discrete front left signal (FL) is adjusted by being attenuated by 1.5 dB, discrete center signal (C) is adjusted by being attenuated by 1.5 dB, discrete surround left signal (SL) is adjusted by being attenuated by 1.5 dB, and the three adjusted signals are mixed and fed to the left surround transducer 110 (SL-T) (as shown at cell 295-2).

At position 15, all signals fed to the front transducers 80, 90, and 100 (FL-T, FR-T and C-T) are adjusted to be attenuated by 60 dB (as shown in cells 295-3, 295-4, and 295-5). In this case, virtually no sound can be heard coming from front transducers. The signals fed to the rear transducers 110 and 130 (SL-T and SR-T), on the other hand, are set back to their original levels and combined with unadjusted front signals (as shown in cells 295-6 and 295-7).

In the front fading control region (between positions 1 and 4 clockwise), the audio image is faded to the front with each counterclockwise step rotation. For operation in this range, the audio signals that pass through the signal processing associated with the control device are not maintained as discrete. For example, the audio is not discrete multi-channel surround sound, but instead uses input signals that are mixed in some manner. However, all of the surround sound information is still present.

From position 4, every counterclockwise step rotation makes signals fed to the front transducers 80, 90, and 100 (FL-T, FR-T and C-T) relatively stronger than signals fed to the rear transducers 110 and 130 (SL-T and SR-T). In this example, the strength of the front signals (FL and FR) fed to the front transducers remains unchanged while the strength of the surround signals (SL and SR) fed to the front transducers generally increases with each counterclockwise step rotation. At the same time, the strength of the signals fed to the rear transducers is decreased for counterclockwise step rotations in the region from position 4 to 1. However, there are a variety of possible implementations for adjusting relative signal strength between the front transducers and the rear transducers such as: 1) keeping signals fed to the rear transducers unchanged and boosting signals fed to the front transducers; 2) attenuating signals fed to the rear transducers and keeping signals fed to the front transducers unchanged; 3) attenuating signals fed to the rear transducers and boosting signals fed to the front transducers. Any of the methods, alone or in combination, may be used to effect a fade function.

As a specific example of the front fading control region, at position 3, a discrete front left signal (FL) passes through without any adjustment (having 0 dB control parameter), discrete surround left signal (SL) is adjusted by being attenuated by 3 dB, and the two adjusted signals are mixed and fed to the front left transducer 80 (FL-T) (as shown in cell 285-1). In another implementation, the front left and surround signals FL and SL could be attenuated by the same magnitude, such as 3 dB. In this case, the signals could be mixed together before being attenuated, rather than after. Also at position 3, the discrete front left signal (FL) is adjusted by being attenuated by 9 dB, the discrete surround left signal (SL) is adjusted by being attenuated by 13 dB, and the adjusted signals are mixed and fed to the left surround transducer 110 (SL-T) (as shown in cell 285-2).

At position 1, all signals fed to the rear transducers 110 and 130 (SL-T and SR-T) are adjusted to be attenuated by 60 dB (as shown in cell 285-3 and 285-4). In this situation, virtually no sound can be heard coming from the rear transducers.

The transition region between the surround level control region and the rear fading control region (between positions 11 and 12 clockwise in FIG. 2) serves as a transition region between the surround signal level and rear fade control functions. Similarly, the transition region between the surround level control region and the front fading control region (between positions 5 and 4 counterclockwise in FIG. 2) serves as a transition region between the surround signal level and front fade control functions. These transition regions may be used to make the transition between control functions as smooth as possible. This smoothing can be accomplished by keeping the system output level approximately constant when switching between surround level control and fading functions and by making the transition between non-mixed and mixed signals as continuous as possible.

Figure 4:
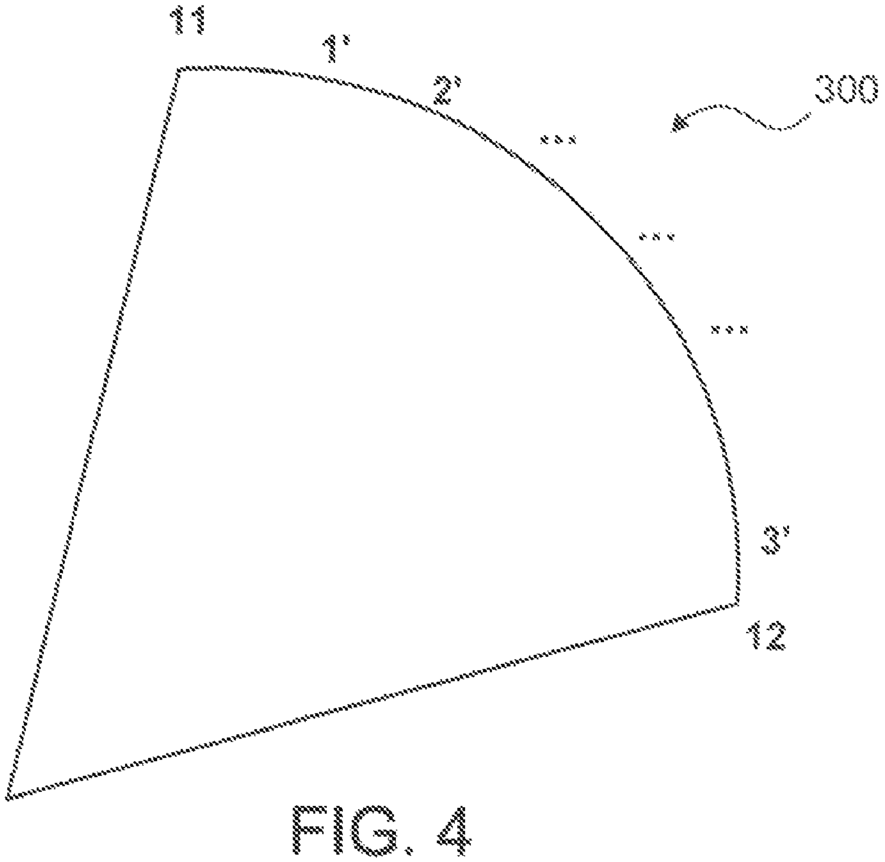
FIG. 4 is a representative diagram of a finer resolution control scheme for the transition region between the surround level control region and the rear fading control region.

FIG. 4 shows a representative diagram of a finer resolution control scheme 300 for the transition region between the surround level control region and the rear fading control region. A similar control scheme may be used for the transition region between the surround level control region and the front fading control region. The finer resolution control scheme 300 includes a plurality of intermediate control positions 1', 2', . . . , and 3'. Each intermediate control position may represent an intermediate level of mixing and an intermediate system output level with respect to positions 11 and 12.

FIG. 5 shows an illustrative control parameter chart 500 of the various input signals and signal levels applied to each transducer for each intermediate position of the control device shown in FIG. 4. The chart represents an example of signal mixing and corresponding gain control parameters values for the transition region between positions 11 and 12. For simplicity, it is assumed that there are three finer intermediate steps between positions 11 and 12, although other numbers of intermediate control positions may be used. A horizontal axis 505 of the chart 500 represents the intermediate control positions 1'-3' as shown in FIG. 4. A vertical axis 510 of the chart 500 represents the six transducers (FL-T 80, FR-T 100, C-T 90, SL-T 110, SR-T 130, and LFE-T 120) as shown in FIG. 1. The chart 500 represents one possible implementation of a transition region for a surround level and fading control system. Other signal mixing combinations and parameter values may be used.

For the front transducers, clockwise step rotations result in an attenuation of the discrete front left, front right, and center signals (FL, FR and C). Surround left and surround right signals (SL and SR) are added to front left and front right signals (FL and FR), respectively, and are boosted at each rotation step. For the rear transducers, the discrete front left and front right signals (FL and FR) are added to the surround left and surround right signals (SL and SR), respectively. In addition, the center signal (C) is added equally to the surround left and surround right signals (SL and SR). The front left, front right, and center signals (FL, FR, and C) are boosted at each rotation step and discrete surround left and surround right signals (SL and SR) are attenuated each step.

For the left front transducer 80 (FL-T), when transitioning from position 11 to 12, the discrete front left signal (FL) will be gradually attenuated from 0 dB at position 11 (as shown at cell 600-1) to −4 dB at position 12 (as shown at cell 600-2). The surround left signal (SL) is gradually mixed in with the discrete front left signal (FL) initially with −60 dB of relative gain (so that it is barely audible) at position 1', and the surround left signal gain is increased with each clockwise step rotation to reach −6 dB at position 12.

For the left surround transducer 110 (SL-T), when transitioning from position 11 to 12 in a clockwise direction, the surround left signal (SL) may be gradually attenuated from 5 dB relative gain at position 11 (as shown at cell 610-1) to −1.5 dB gain at position 12. As the transition is made, front left and center signals (FL and C) are gradually mixed in with the discrete surround left signal (SL). Specifically, discrete front left and center signals (FL and C) are gradually mixed in starting with −60 dB relative gain at position 1', and gains for the front left and center signals (FL and C) are increased with each clockwise step rotation to −1.5 dB at position 12 (as shown at cell 610-2). Other possible implementations of the transition region are possible. For example, other parameter values may be used and alternative mixing methods may be used.

The second transition region between surround level control and forward fading control may use a transition method similar to that shown in FIG. 5.

Figure 6:
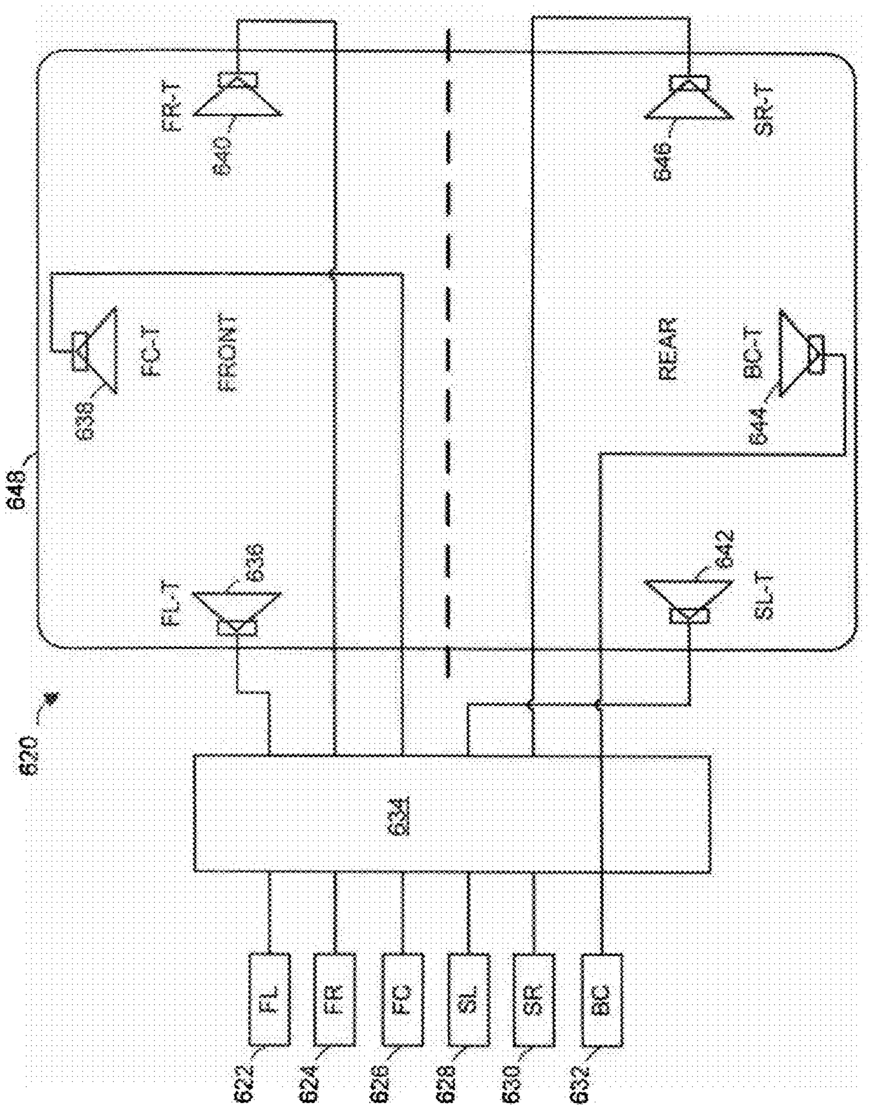
FIG. 6 is a block diagram of spatially diverse transducers in a multi-channel discrete surround sound system in an automotive listening environment.

FIG. 6 is a block diagram of spatially diverse transducers in a multi-channel discrete surround sound system 620 in an automotive listening environment. The surround sound system uses a plurality of discrete surround sound source signals corresponding to a front left (FL) channel 622, a front right (FR) channel 624, a front center (FC) channel 626, a surround left (SL) channel 628, a surround right (SR) channel 630, and a back center (BC) channel 632. Although six source signal channels are illustrated and described, the number of source signal channels may vary. For example, the surround sound system 620 can also include a low-frequency effects (LFE) channel. Thus, the multi-channel discrete surround sound system 620 can be a 5.1, 6.1, 7.1 or an 8.1 discrete surround system, for example.

The discrete signals 622-632 are received by a signal processor 634 for operating on the signals 622-632. The signal processor 634 may be implemented in the form of a digital signal processor (DSP) or in analog circuitry. The signal processor 634 performs one or more functions on the various input signals 622-632 to create output signals. One function that may be performed by the signal processor 634 is alteration of signal gain. The signal processor 634 can either attenuate or boost (in either absolute or relative terms) one or more of signals 622-632 based on selected control parameters, as will be described in more detail below.

Another function that can be performed by the signal processor 634 is signal mixing. The signals 622-632 can be mixed together in some fashion within signal processor 634, with variable relative or absolute gain. Mixing can include adjusting via attenuating or boosting the relative or absolute level of the input signal subsets to be mixed and summing together the adjusted input signals. One or all of the output signals can contain components of multiple (i.e., more than one) input signals. The number of input signals 622-632 can differ from the number of output signals.

The signal processor 634 can perform still other functions on the various input signals 622-632 to create the output signals. For example, the difference between a pair of signals could be taken and output as a signal. The described techniques are not limited in the functions (e.g., mixing) that can be performed on the input signals and are not limited in the number of input signals or output signals that can be present.

After the desired functions have been performed, the output signals from the signal processor 634 can be selectively sent to a plurality of spatially diverse transducers. The transducers can include a front left transducer (FL-T) 636, a front center transducer (FC-T) 638, a front right transducer (FR-T) 640, a surround left transducer (SL-T) 642, a back center transducer (BC-T) 644, and a surround right transducer (SR-T) 646. The various transducers 636-646 can be installed in a vehicle 648. Similar to the number of source signals, the number of transducers can also be smaller than or larger than six.

The values of control parameters that can be used to adjust the input (source) signals, with or without mixing, may be selected depending on a variety of factors, such as the location of the transducers and whether the signal processor 634 performs signal mixing, surround sound level control, image fading control, or a combination of signal processing. The control parameters may also depend on the acoustic characteristics of the listening environment, such as the type of upholstery in the vehicle, number of seats, number of passengers, headliner material, interior volume, etc.

In some embodiments, a separate fader control and surround level control can be used to control the input signals 622-632. For example, the fader control and/or the surround level control can each include a single degree of freedom rotary controller. The controller is not restricted to a rotary control device, however. Other controls such as a slider, or +/− (increment/ decrement control) control set, can also be implemented. The control can include a potentiometer for varying an analog signal or control voltage, or can be an encoder that outputs a digital code depending on position or actuation of the control device. A digital encoder (which may be rotary, linear, increment/decrement or some other type of control device) can be used for digital (DSP) implementations.

The control device can be in the form of a remote control or a controller mounted somewhere in the listening environment. The control device may also be located on a component of the surround sound system, such as the control interface unit for a vehicle audio system. For simplicity, the following description assumes use of a rotary control device, although the techniques are equally applicable in connection with other types of control devices. In one embodiment, the level (gain) of the surround signals that are mixed can be controlled by a separate surround level control described with reference to FIG. 7. For example, the surround signal level control can increase or decrease the gain of the rear surround signals that are applied to the rear transducers 642, 644, 646 of FIG. 6.

In addition, the surround signal level control can increase or decrease the gain of the rear surround signals that are mixed with the front signals during the front fading operation. This can affect the gain of the portion of the rear surround signals that are mixed with the front signals and therefore change the gain ratio of the rear surround signals to the front signals. For example, the surround signal level control can increase the gain of the surround signals that are mixed with the front signals so that the surround signals are more prominent in the signal mix. Alternatively, the surround signal level control can decrease the gain of the surround signals that are mixed with the front signals so that the surround signals are less prominent in the signal mix. In one embodiment, the gain of the surround signals is predetermined to keep the sound energy constant in the vehicle.

In order to retain front center channel information when fading backward, at least a portion of the front center channel signal can be mixed with the rear surround signals in the rear fading region. The percentage of the front center channel signal that is mixed with the rear surround signals can remain constant or can change as the fader control gradually fades backward. Mixing parameters can be controlled by the degree of backward fading and the front center channel signal level. For example, the percentage of the front center channel signal that is mixed with the rear surround signals increases as the fader control gradually fades backward to position. The level (gain) of the front center channel signal that is mixed can be controlled by a separate center channel level control (not shown), or by a portion of the surround level control described with reference to FIG. 7. For example, a portion of the surround signal level control can control the gain of the front center channel signal. The portion of the surround signal level control can increase or decrease the gain of the front center channel signal that is applied to the front center channel transducer 638 of FIG. 6.

It should be noted that front left and/or front right channel information could be directly retained when fading backward by mixing at least a portion of the front left and/or front right channel information with the rear surround signals in the rear fading region. In one embodiment, the front center channel information includes the front left and/or front right channel information. Thus, retaining the center channel information also retains the front left and/or front right channel information.

Figure 7:
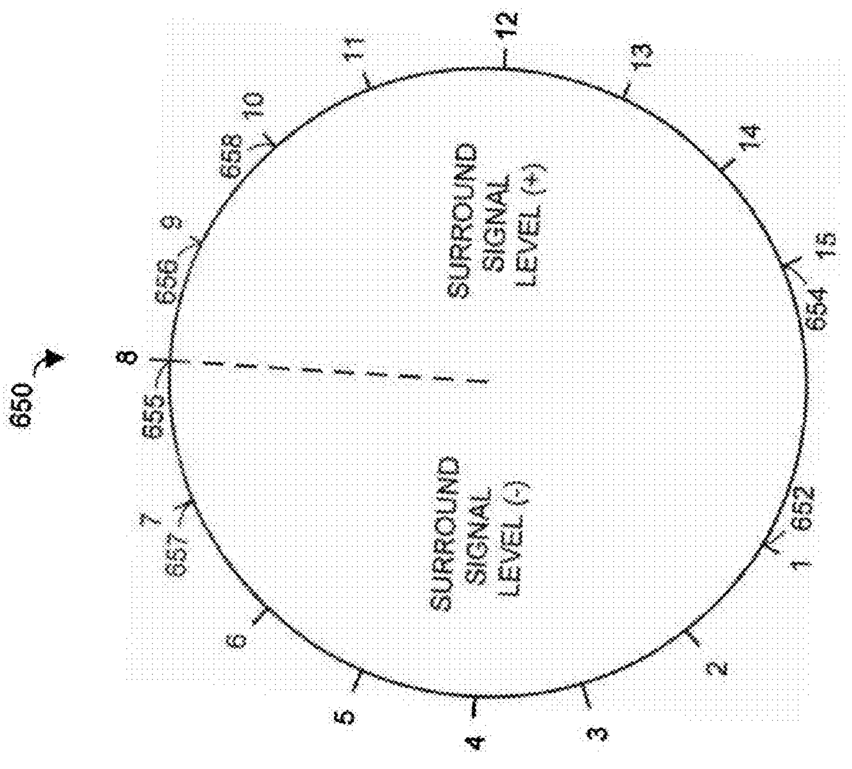
FIG. 7 illustrates a rotary control diagram for a surround level control according to one embodiment of the invention.

FIG. 7 illustrates a rotary control diagram for a surround level control 650 according to one embodiment of the invention. The surround level control 650 is shown as a rotary controller, however, other controls such as a slider, or +/− (increment/decrement control) control set, can also be implemented. The surround level control 650 can include a potentiometer for varying an analog signal or control voltage, or can be an encoder that outputs a digital code depending on position or actuation of the surround level control 650. A digital encoder (which may be rotary, linear, increment/decrement, or some other type of control device) may be used for digital (DSP) implementations. The surround level control 650 can be in the form of a remote control or a controller mounted somewhere in the listening environment. The surround level control 650 can also be located on a component of the surround sound system, such as the control interface unit for a vehicle audio system.

The surround level control can control the gain of the surround sound signals. For example, each clockwise rotation step can increase the surround signal level by 1.5 dB. The surround level control 650 can simultaneously control a single monophonic surround signal, a stereo pair of surround signals, or multi-channel surround signal levels (e.g., left surround, left center surround, right center surround, and right surround, as might be present in a 7.1 channel implementation).

In the example of FIG. 7, a total level change of 21 dB (14*1.5) could be produced by clockwise rotation of the rotary control device from position one 652 to position fifteen 654. In one implementation, position eight 655 can correspond to a 0.0 dB surround level adjustment relative to the original input surround signals, position fifteen 654 can correspond to a +10.5 dB adjustment relative to position eight 655 (each step, such as from positions eight 655 to position nine 656, increases the level by 1.5 dB), and position one 652 can correspond to −10.5 dB adjustment relative to position eight 655 (each step, such as from positions eight 655 to position seven 657, decreases the level by 1.5 dB). The step sizes described here are used for illustrative purposes and, in actual implementations, can be varied as desired. Additionally, the level change with each step change need not be constant. The level change when moving from position eight 655 to position nine 656 can be different from the level change when moving from position nine 656 to position ten 658, and so on.

Figure 8:
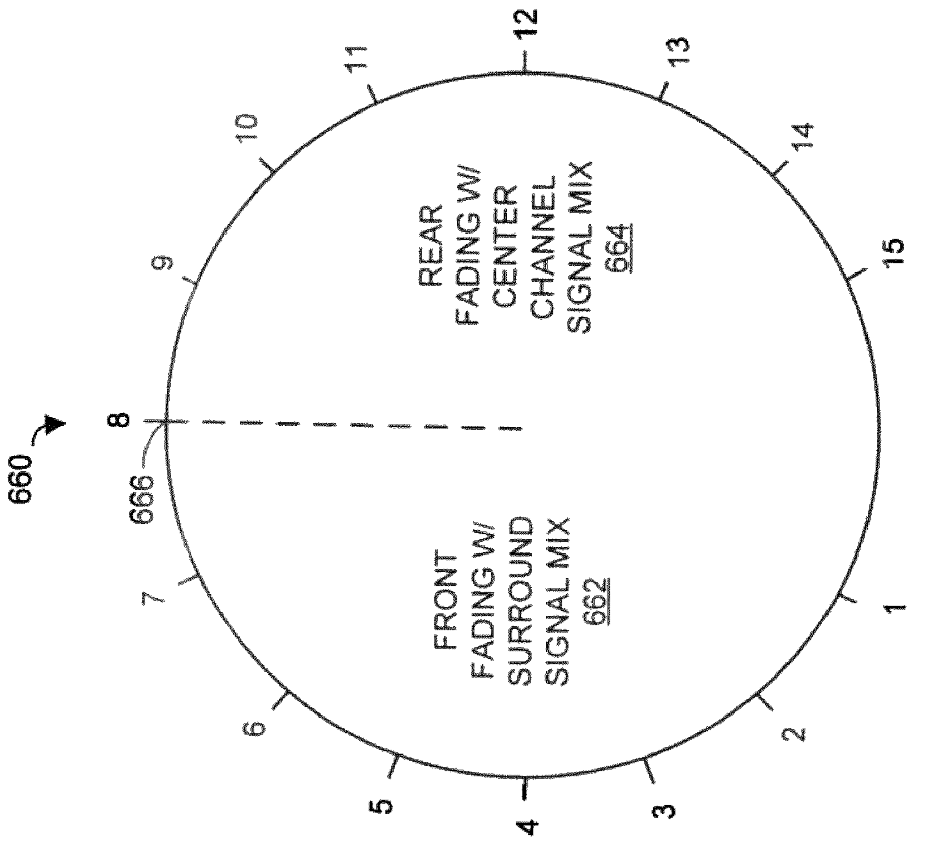
FIG. 8 illustrates a rotary control diagram for a fader control according to one embodiment of the invention.

FIG. 8 illustrates a rotary control diagram for a fader control 660 according to one embodiment of the invention. The fader control 660 includes a front fading region 662 and a rear fading region 664. The fader control 660 can also include a center position 666 which corresponds to a nonfaded position or a neutral fading position. In one embodiment, the front fading region 662 also includes surround sound mixing for downmixing one or more surround sound signals with front audio signals, such as the front left (FL) channel 622, the front right (FR) channel 624, and/or the front center (FC) channel

626 of FIG. 6. The surround sound signals can be mixed with the front audio signals as the fader control 660 is rotated counterclockwise from the center position 666. In one embodiment, the rear fading region 654 also includes center channel mixing for downmixing a center channel signal with rear surround sound signals. The center channel signal can be mixed with the rear surround sound signals as the fader control 660 is rotated clockwise from the center position 666.

Although the fader control 660 is shown having two symmetric regions, the front fading region 662 and the rear fading region 664, there are numerous ways in which to divide the regions. For example, the front fading region 662 can be larger than the rear fading region 664 or the rear fading region 664 can be larger than the front fading region 662. Also, although a total of fifteen tuning steps are shown, a greater or a fewer numbers of tuning steps can be used.

In one embodiment, the fader control 660 operates as follows. In the rear fading region 654 between position eight and position fifteen, the output level of the front transducers (FL-T 636, FR-T 640, FC-T 638 of FIG. 6) with respect to the rear transducers (SL-T 642, SR-T 646, BC-T 644 of FIG. 6) can be adjusted for each tuning step. This adjustment can be accomplished by operating on the signals that are applied to the different transducers. For example, a mixing function can be performed when the fader control 660 is actuated over the rear fading region 664 portion of the rotary controller's operating range to downmix center channel information into the rear transducers. Furthermore, the rear fading region 664 can mix and/or control a different set of signals (e.g., mixing of more than just center channel information into the surround signals can be performed).

For example, clockwise rotation of the fader control 660 in the rear fading region 664 can cause the signals fed to the rear transducers 642, 644, 646 to be stronger than the signals fed to the front transducers 636, 638, 640 (i.e., a rear fade function). In addition, the signals fed to the rear transducers 642, 644, 646 can have components of one or more of the front left 622, front center 626, and front right 624 input signals. The signals fed to the front transducers 636, 638, 640 may also contain information from the surround input signals 628, 630. In some embodiments, the signals fed to the front and/or rear transducers can also contain information from low frequency effects input signals (not shown).

There are a variety of techniques to adjust relative output levels of the front 636, 638, 640 and rear transducers 642, 644, 646. For a clockwise rotation of the fader control 660 in the rear fading region 664, fading can be accomplished by keeping signals fed to the front transducers 636, 638, 640 unchanged and boosting signals fed to the rear transducers 642, 644, 646; attenuating signals fed to the front transducers 636, 638, 640 and keeping signals fed to the rear transducers 642, 644, 646 unchanged; boosting signals fed to the front transducers 636, 638, 640 and attenuating signals fed to the rear transducers 642, 644, 646; or attenuating signals fed to the front transducers 636, 638, 640 and boosting signals fed to the rear transducers 642, 644, 646.

In the front fading region 662 between position one and position eight, the output level of the rear transducers (SL-T 642, SR-T 646, and BC-T 644) with respect to the front transducers (FL-T 636, FR-T 640, and FC-T 638) can be adjusted for each tuning step. This adjustment may be accomplished by operating on the signals that are applied to the different transducers. For example, a mixing function can be performed when the fader control 660 is actuated over the front fading region 662 portion of the operating range of the fader control 660 to downmix surround sound signal information into the front transducers 636, 638, 640. Furthermore, the front fading region 662 can mix and/or control a different set of signals (e.g., mixing of more than just surround sound signal information into the front audio signals can be performed).

For example, counterclockwise rotation of the fader control 660 in the front fading region 662 can cause the signals fed to the front transducers 636, 638, 640 to be stronger than the signals fed to the rear transducers 642, 644, 646 (i.e., a front fade function). In addition, the signals fed to the front transducers 636, 638, 640 can have components of the left surround 628 and right surround input signals 630. The signals fed to the rear transducers 642, 644, 646 can also contain information from the front input signals 622, 624, 626. In some implementations, the signals fed to the front and/or rear transducers may also contain information from the low frequency effects input signal, if present.

The combination of signals can be mixed and/or controlled in a different way for operation in the front fading region 662 as compared to operation in the rear fading region 664. For example, operation in the rear fading region 664 can result in signals being fed to the rear transducers 642, 644, 646 that have significant front signal components, while operation in the front fading region 662 can result in signals being fed to the front transducers 636, 638, 640 that have relatively small surround sound signal components.

There are a variety of possible methods to adjust relative output levels of the front 636, 638, 640 and rear transducers 642, 644, 646. For counterclockwise rotations of the fader control 660 in the front fading region 662, fading can be accomplished by keeping signals fed to the rear transducers 642, 644, 646 unchanged and boosting signals fed to the front transducers 636, 638, 640; attenuating signals fed to the rear transducers 642, 644, 646 and keeping signals fed to the front transducers 636, 638, 640 unchanged; or attenuating signals fed to the rear transducers 642, 644, 646 and boosting signals fed to the front transducers 636, 638, 640.

Figure 9:
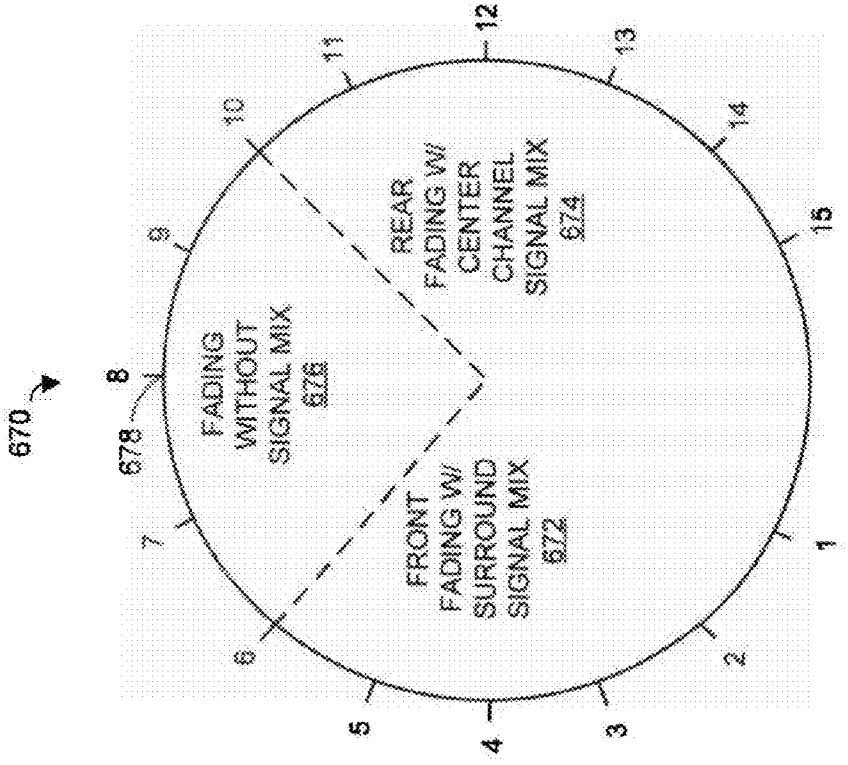
FIG. 9 illustrates a rotary control diagram for a fader control according to another embodiment of the invention.

FIG. 9 illustrates a rotary control diagram for a fader control 670 according to another embodiment of the invention. The fader control 670 of FIG. 9 is similar to the fader control 650 of FIG. 8 and includes a front fading region 672 and a rear fading region 674. The fader control 670 also includes an additional pure fading region 676. The pure fading region 676 is configured to include a pure fading function in the middle range of the fader control 670. By "pure fading function," we mean that no signal mixing is performed in the pure fading region 676. In one embodiment, the pure fading region 676 comprises approximately thirty percent of the full range of the fader control 670. However, the pure fading region 676 can comprise a larger or smaller percentage of the full range of the fader control 670. Additionally, the center position 678 can correspond to a nonfaded position. The front fading region 672 and the rear fading region 674 can be configured as previously described with reference to the front fading region 662 and the rear fading region 664 of FIG. 8.

In one embodiment, the sound energy can be kept constant in the pure fading region 676, as well as in the front 672 and the rear fading regions 674. As previously described, the pure fading region 676 is a region that performs pure fading without downmixing. The front 672 and the rear fading regions 674 augment the fade control with downmixing to preserve selected signal contents. It should be noted that the invention can be implemented with additional control regions including a fade control that is augmented with downmixing to preserve selected signal contents as shown in FIG. 8. Additionally, it should be noted that the fader control 660 of FIG. 8 and fader control 670 of FIG. 9 can be used with the surround level control 650 of FIG. 7 to provide independent adjustment of the surround signal level.

The regions can be divided in numerous ways. Each region can introduce various signal gain depending on the position of the fader control 670. Additionally, the type and degree of signal mixing can also be made to depend on the position of the fader control 670. Other signal effects such as phase delays and/or equalization can also be applied that correspond to the position of the fader control 670. In one embodiment, the fading regions are defined in terms of gain only.

Figure 10:
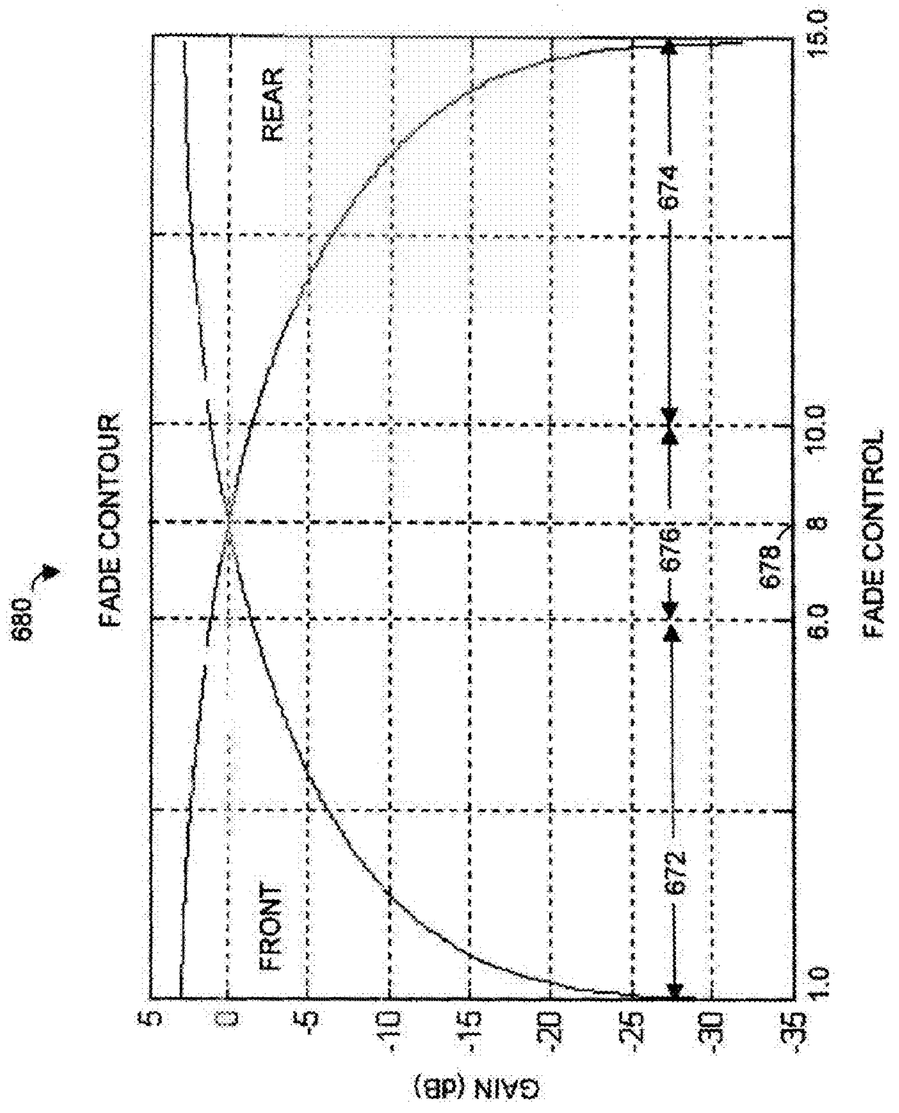
FIG. 10 illustrates a graph of a fade contour according to one embodiment of the invention.

FIG. 10 illustrates a graph 680 of a fade contour according to one embodiment of the invention. The graph 680 can correspond to the fader control 650 of FIG. 8 or the fader control 670 of FIG. 9. In the example using the fader control 670 of FIG. 9, the center position 678 is shown at position eight. The pure fading region 676 is between about position 6.0 and about position 10.0. At position 6.0, the gain of the front audio signals is increased by about 1.5 dB, while the gain of the rear surround audio signals is decreased by about 2.5 dB. At position 10.0, the gain of the rear surround audio signals is increased by about 1.5 dB, while the gain of the front audio signals is decreased by about 2.5 dB.

In the front fading region 672, the gain of the front audio signals is gradually increased to about 3.0 dB at position 1.0, while the gain of the rear surround audio signals is initially decreased in a gradual manner and then rapidly decreased to about −28 dB at position 1.0. In the rear fading region 674, the gain of the rear audio signals is gradually increased to about 3.0 dB at position 15.0, while the gain of the front surround audio signals is initially decreased in a gradual manner and then rapidly decreased to about −33 dB at position 15.0.

In order to retain rear surround information when fading forward, at least a portion of the rear surround signals can be mixed with the front signals in the front fading region 672. Mixing parameters can be controlled by the degree of forward fading and the surround signal level. For example, the amount of the rear surround signals that are mixed with the front signals increases as the fader control 670 gradually fades forward to position 1.0.

In one embodiment, the position of the fader control 670 can be determined by calculating the ratio of the gains from the front and rear signals. For example, the ratio of the front left signal to the rear left signal is equivalent to the ratio of the front right signal to the rear right signal, assuming a stereo configuration. Thus, the ratio x (assuming fade to rear) can be expressed as follows:

$$x = \text{front}/\text{rear}$$

The calculation can occur at any rate including lower (decimated) sample rates. Additionally, any indicator of signal strength can be used in the calculation of the ratio, such as root-mean-square (RMS) signal level. RMS can minimize errors due to time variations and minor signal glitches, for example. Also, left and right signals can be summed in order to negate the effect of balance on the signal levels.

The fade contour 680 can be generated by using the ratio x for each position of the fader control 670. The fade contour 680 is a graph of fader gain relative to the position of the fader control. A polynomial can be used to approximate the fade contour. The polynomial can be expressed as follows:

$$\text{Fade Contour} = P_0 + P_1 x + P_2 x^2 + \ldots + P_N x^N$$

The coefficients of the polynomial can be calculated using a model, such as a “least squares fit” model, for example. The order of the polynomial is determined based on the desired precision of the fit. For example, a third-order or higher-order polynomial can be used. In one embodiment, a lookup table that contains the signal ratio to fader gain information could also be implemented to generate the fade contour.

The determination of the position of the fader control can be used by an amplifier (having a processor) that is coupled to a head unit through the pre-amplifier outputs of the head unit. By knowing the position of the fader control, the amplifier can process signals from the head unit to improve system performance, such as adjustments of equalization parameters, while maintaining the fader position desired by the user.

In one configuration, the amplifier can also recover an approximation of the original stereo signal as follows. The original stereo signal can be approximated by taking a weighted average of the faded signals from the head unit of the audio system.

$$\text{Left}(t) = a \times \text{front} \times \text{Left}(t) + a \times \text{rear} \times \text{Left}(t)$$

$$\text{Right}(t) = a \times \text{front} \times \text{Right}(t) + a \times \text{rear} \times \text{Right}(t)$$

The ratio x can be expressed as follows (assuming fade to front):

$$x = \text{rear}/\text{front}$$

Solving for a results in the following equation:

$$1 = a \times \text{front} + a \times \text{rear} = a \times (1 + x) \times \text{front}$$

In many applications, the front has unity gain when the fade control fades the signals forward. In other words, the gain in the direction that is opposite to the direction of the fade is affected by the fade control. For example, front has unity gain and rear has attenuated gain when faded forward; conversely, rear has unity gain when faded rearward and front has attenuated gain. Under this assumption, the scaling coefficient a can be expressed as follows:

$$a = 1/1 + x$$

The weighting function a(x) can be generated by using the ratio x for each position of the fader control 670. A polynomial can be used to approximate the weighting function. The polynomial can be expressed as follows:

$$a(x) = P_0 + P_1 x + P_2 x^2 + \ldots + P_N x^N$$

The coefficients of the polynomial can be calculated using a model, such as a “least squares fit” model, for example. The order of the polynomial is determined based on the desired precision of the fit. For example, a third-order or higher-order polynomial can be used. In one embodiment, a lookup table that contains the signal ratio to fader gain information could also be implemented to generate the fade contour. The value of a can be thus be determined. The original stereo signal can then be approximated by substituting the value of a in the previously described equations.

Figure 11:
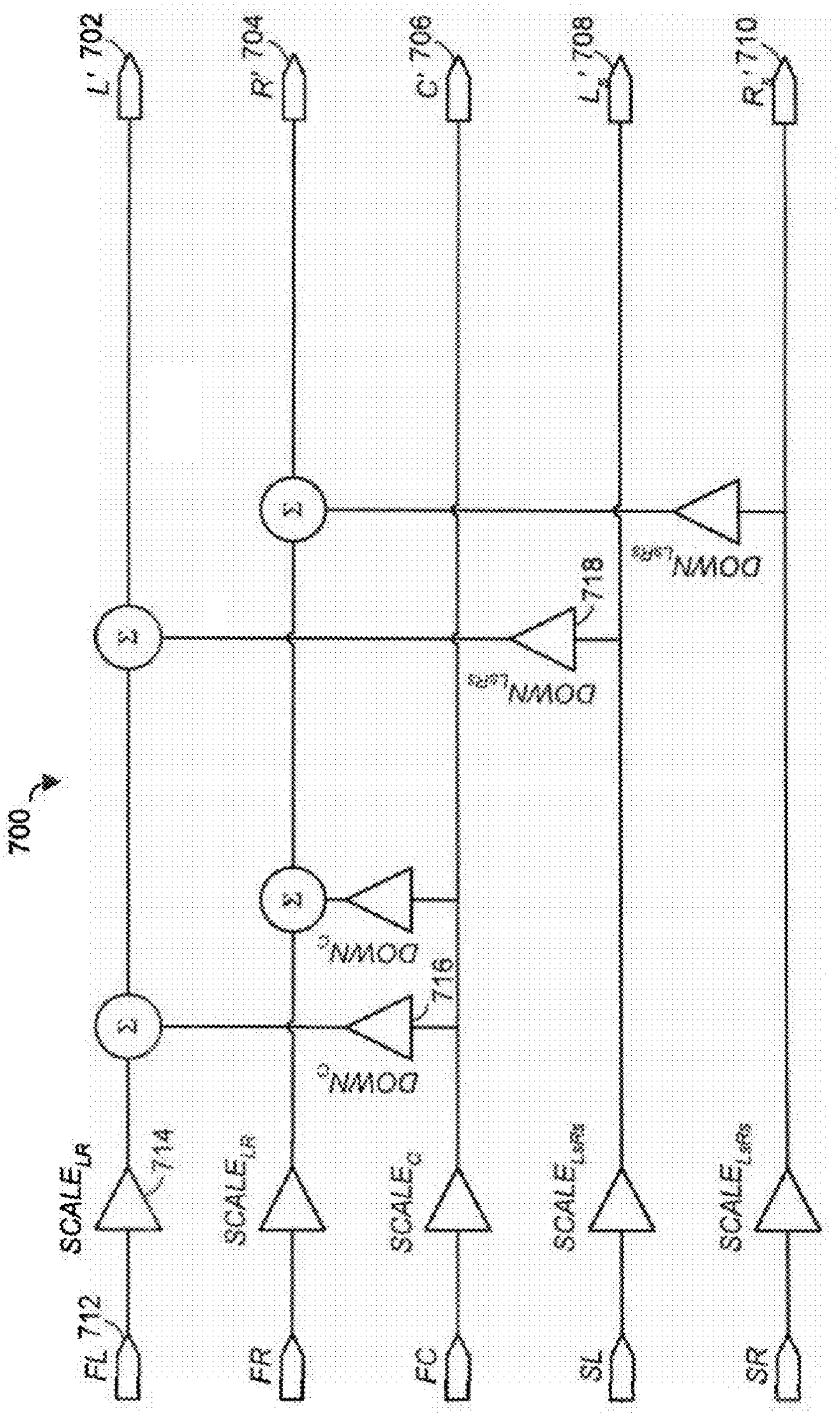
FIG. 11 illustrates a schematic diagram of a downmix module according to one embodiment of the invention.

FIG. 11 illustrates a schematic diagram of a downmix module 700 according to one embodiment of the invention. The downmix module 700 operates on surround sound system, such as a 5.1, 6.1, or 7.1 surround sound configuration. As previously discussed, it is possible to drop signal information in the extreme fade positions if deliberate preservation of specific signal contents, such as via downmixing as shown in FIG. 11, is not taken into consideration. For example, in a typical surround sound system, the surround signals will be lost if the audio is faded completely forward. The downmix module 700 is shown in a schematic diagram to better illustrate its operation. There are numerous analog and digital circuit designs that can be used to implement the downmix module 700.

The present invention provides a technique to preserve signal information, such as surround channels or a center channel when performing fading control in a listening environment such as in a vehicle cabin or listening room. For example, in a typical surround application with spatially diverse transducers, such as is shown in FIG. 6, certain signals can be preserved when fading forward and backward. In some configurations, such as for facilitating tuning or a specific design, specific signals can always be present by design. For example, the stereo pair L' and R' can be configured to always be present in both the front fading region 672 and the rear fading region 674 of FIG. 9.

Thus, the surround channels and the center channel content can be preserved by mixing at least a portion of each of the surround channels or at least a portion of the center channels into L' and R'. The downmix module 700 illustrated in FIG. 11 can include a gain cell for each channel to facilitate independent content scaling (i.e. signal level control).

The outputs of the downmix module 700 can be mathematically described as follows:

$$L'=(\text{scale}_{LR}\cdot FL)+(\text{down}_{LsRs}\cdot L_s')+(\text{down}_C\cdot C')$$

$$R'=(\text{scale}_{LR}\cdot FR)+(\text{down}_{LsRs}\cdot R_s')+(\text{down}_C\cdot C')$$

$$C'=\text{scale}_C\cdot FC$$

$$L_s'=\text{scale}_{LsRs}\cdot SL$$

$$R_s'=\text{scale}_{LsRs}\cdot SR$$

where L' 702 is the output of the front left channel of the downmix module 700, R' 704 is the output of the front right channel of the downmix module 700, C' 706 is the output of the front center channel of the downmix module 700, $L_s$' 708 is the output of the left surround channel of the downmix module 700, and $R_s$' 710 is the output of the right surround channel of the downmix module 700.

In one example, the output of the front left channel (L' 702) is a downmixed signal that includes the product of the front left signal (FL 712) and a scale factor or coefficient ($\text{scale}_{LR}$ 714) summed with the product of the output of the front center channel (C' 706) and a coefficient ($\text{down}_C$ 716) summed with the product of the output of the left surround channel ($L_s$' 708) and a coefficient ($\text{down}_{LsRs}$ 718). Thus, the downmix module 700 mixes the left surround channel ($L_s$' 708) with the front left channel (FL 712) to preserve the left surround information during a front fade operation. The proportions of the signals that are mixed are determined by the coefficients $\text{scale}_{LR}$ 714, $\text{down}_C$ 716, and $\text{down}_{LsRs}$ 718.

There are numerous methods of determining the coefficients (i.e., $\text{scale}_{LR}$, $\text{down}_C$, $\text{down}_{LsRs}$) depending on specific design objects, such as optimizing the perceived sound effects, keeping sound energy constant, or controlling the amount of signal mix, for example.

Figure 12:
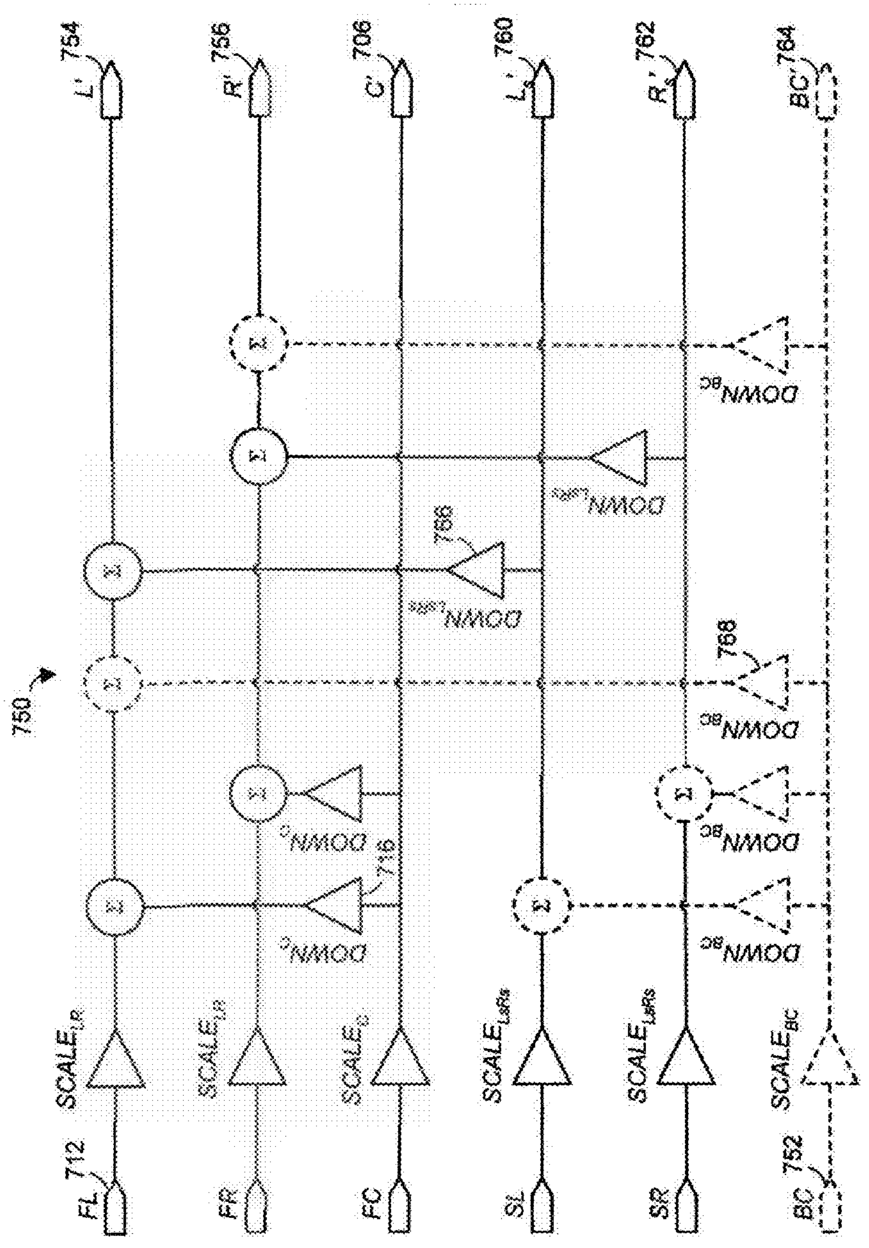
FIG. 12 illustrates a schematic diagram of a downmix module according to another embodiment of the invention.

FIG. 12 illustrates a schematic diagram of a downmix module 750 according to another embodiment of the invention. The downmix module 750 is similar to the downmix module 700 of FIG. 11 with the addition of a back center channel 752. Other downmix modules can also be used. As previously discussed, signal information can be lost in the extreme fade positions if deliberate preservation of specific signal contents is not taken into consideration. The downmix module 750 is shown in a schematic diagram to better illustrate its operation. There are numerous analog and digital circuit designs that can be used to implement the downmix module 750.

The downmix module 750 illustrated in FIG. 12 includes a gain cell for each channel to facilitate independent content scaling (i.e. signal level control). The outputs of the downmix module 750 can be mathematically described as follows:

$$L'=(\text{scale}_{LR}\cdot FL)+(\text{down}_{LsRs}\cdot L_s')+(\text{down}_C\cdot C')+(\text{down}_{BC}\cdot BC')$$

$$R'=(\text{scale}_{LR}\cdot FR)+(\text{down}_{LsRs}\cdot R_s')+(\text{down}_C\cdot C')+(\text{down}_{BC}\cdot BC')$$

$$C'=\text{scale}_C\cdot FC$$

$$L_s'=(\text{scale}_{LsRs}\cdot SL)+(\text{down}_{BC}\cdot BC')$$

$$R_s'=(\text{scale}_{LsRs}\cdot SR)+(\text{down}_{BC}\cdot BC')$$

$$BC'=\text{scale}_{BC}\cdot BC$$

where L' 754 is the output of the front left channel of the downmix module 750, R' 756 is the output of the front right channel of the downmix module 750, C' 706 is the output of the front center channel of the downmix module 750, $L_s$' 760 is the output of the left surround channel of the downmix module 750, $R_s$' 762 is the output of the right surround channel of the downmix module 750, and BC' 764 is the output of the back center channel of the downmix module 750.

In one example, the output of the front left channel (L' 754) is a downmixed signal that includes the product of the front left signal (FL 712) and the coefficient ($\text{scale}_{LR}$ 714) summed with the product of the output of the front center channel (C' 706) and the coefficient ($\text{down}_C$ 716) summed with the product of the output of the left surround channel ($L_s$' 760) and a coefficient ($\text{down}_{LsRs}$ 766) summed with the product of the output of the back center channel (BC' 764) and a coefficient ($\text{down}_{BC}$ 768). Thus, the downmix module 700 mixes the left surround channel ($L_s$' 760) and the back center channel (BC' 764) with the front left channel (FL 712) to preserve the left surround information during a front fade operation. The proportions of the signals are determined by the coefficients $\text{scale}_{LR}$ 714, $\text{down}_C$ 716, $\text{down}_{BC}$ 768 and $\text{down}_{LsRs}$ 766.

In addition to the downmix module 750, a signal mixer can also be used to further control signal content and signal gain level. A two-module design includes an additional degree of freedom from the interaction of the downmix module 750 and the signal mixer for controlling the signal levels of the various signals. For example, when fading forward, the overall gain of the signals at the front left 636 (FIG. 6) and the front right transducers 640 (FIG. 6) can be modified independently by coefficients in the downmix module 750 and coefficients in the signal mixer.

FIG. 13 is an illustrative signal mixer 800 having signal mixing coefficients for various channels in a surround sound system according to the invention. The signal mixer 800 of FIG. 13 is illustrated in a table format. In one embodiment, the signal mixer 800 is positioned after the downmix module 700 of FIG. 11. However, it should be noted that the signal mixer could be positioned before the downmix module 700 or can be integrated with the downmix module 700 in a single module implementation. The signal mixer 800 is shown in a table format to better illustrate its operation. There are numerous analog and digital circuit designs that can be used to implement the signal mixer 800.

The signal mixer 800 includes columns corresponding to the output of the front left channel L' 702, the output of the front right channel R' 704, the output of the front center channel C' 706, the output of the left surround channel $L_s$' 708, and the output of the right surround channel $R_s$' 710 of the downmix module 700. Each of the columns includes various coefficients that can be applied to the signals. The fade column 802 includes fader coefficients (e.g., fading gains) indicated as front 804 and rear 806 that can also be applied to the signals depending on the particular fading region. The coefficients front 804 and rear 806 can vary with position of the fade control. For example, the coefficient front 804 can increase and the coefficient rear 806 can decrease as the fader control is faded forward.

The signal mixer 800 includes rows corresponding to the outputs of the signal mixer 800 which will be fed to the various speakers. The front left output is indicated by FL' 812, the front right output is indicated by FR' 814, the front center output is indicated by FC' 816, the surround left output is indicated by SL' 818, and the surround right output is indicated by SR' 820. An optional back center output is indicated by BC' 822.

The output for the front left channel (FL' 812) according to the signal mixer 800 can be represented as follows:

$$FL' = \mathrm{front}(a\cdot L' + b\cdot C') = (\mathrm{front}\cdot a\cdot L') + (\mathrm{front}\cdot b\cdot C')$$

Substituting L' and C' from the downmix module 700 of FIG. 11 yields the following:

$$FL' = \mathrm{front}\cdot a\cdot(\mathrm{scale}_{LR}\cdot FL + \mathrm{down}_{LsRs}\cdot Ls' + \mathrm{down}_C\cdot C') + \mathrm{front}\cdot b\cdot C' = (\mathrm{front}\cdot a\cdot \mathrm{scale}_{LR})\cdot FL + (\mathrm{front}\cdot a\cdot \mathrm{down}_{LsRs}\cdot \mathrm{scale}_{LsRs})\cdot SL + (\mathrm{front}\cdot a\cdot \mathrm{down}_C\cdot \mathrm{scale}_C + \mathrm{front}\cdot b\cdot \mathrm{scale}_C)\cdot FC$$

Similarly, the output for the front right channel (FR' 814) according to the signal mixer 800 can be represented as follows:

$$FR' = \mathrm{front}(a\cdot R' + b\cdot C') = (\mathrm{front}\cdot a\cdot R') + (\mathrm{front}\cdot b\cdot C')$$

Substituting R' and C' from the downmix module 700 of FIG. 11 yields the following:

$$FR' = \mathrm{front}\cdot a\cdot(\mathrm{scale}_{LR}\cdot FR + \mathrm{down}_{LsRs}\cdot Rs' + \mathrm{down}_C\cdot C') + \mathrm{front}\cdot b\cdot C' = (\mathrm{front}\cdot a\cdot \mathrm{scale}_{LR})\cdot FR + (\mathrm{front}\cdot a\cdot \mathrm{down}_{LsRs}\cdot \mathrm{scale}_{LsRs})\cdot SR + (\mathrm{front}\cdot a\cdot \mathrm{down}_C\cdot \mathrm{scale}_C + \mathrm{front}\cdot b\cdot \mathrm{scale}_C)\cdot FC$$

In the pure fading region 676 of FIG. 9, a pure fading function is applied and the downmix module is effectively bypassed. This can be achieved by setting the coefficients as follows:

$$\mathrm{scale}_{LR} = \mathrm{scale}_{LsRs} = \mathrm{scale}_C 16\ 0$$

$$\mathrm{down}_C = 0$$

$$\mathrm{down}_{LsRs} = 0$$

This yields front left (FL' 812) and front right signals (FR' 814) without deliberately preserving surround content as follows:

$$FL' = (\mathrm{front}\cdot a\cdot \mathrm{scale}_{LR})\cdot FL + (\mathrm{front}\cdot b\cdot \mathrm{scale}_C)\cdot FC$$

$$FR' = (\mathrm{front}\cdot a\cdot \mathrm{scale}_{LR})\cdot FR + (\mathrm{front}\cdot b\cdot \mathrm{scale}_C)\cdot FC$$

Thus, in the pure fading region 676, surround signal content is not deliberately preserved when fading forward. By design of the signal mixer 800 (FIG. 13), at least a portion of the front center channel signal content is downmixed with the front left and the front right signals. However, the center channel signal content can be dropped by setting the coefficient b to zero. In one embodiment, the portion of the center channel signal is not downmixed with the front left and the front right signals as will be described with reference to FIG. 14.

In the front fading region 672 of FIG. 9, the signals are faded and downmixing occurs to preserve surround signal content. Since front center channel content is generally present in the forward fade position, the coefficient $\mathrm{down}_C$ can be set to zero. However, the coefficient $\mathrm{down}_C$ can be set to non-zero values if desired. The preservation of the surround signal is accomplished by setting the coefficient $\mathrm{down}_{LsRs}$ to a non-zero value. This yields front left (FL' 812) and front right signals (FR' 814) with preserved surround signal content as follows:

$$\mathrm{scale}_{LR} = \mathrm{scale}_{LsRs} = \mathrm{scale}_C \neq 0$$

$$\mathrm{down}_C = 0$$

$$\mathrm{down}_{LsRs} \neq 0$$

$$FL' = (\mathrm{front}\cdot a\cdot \mathrm{scale}_{LR})\cdot FL + (\mathrm{front}\cdot a\cdot \mathrm{down}_{LsRs}\cdot \mathrm{scale}_{LsRs})\cdot SL + (\mathrm{front}\cdot b\cdot \mathrm{scale}_C)\cdot FC$$

$$FR' = (\mathrm{front}\cdot a\cdot \mathrm{scale}_{LR})\cdot FR + (\mathrm{front}\cdot a\cdot \mathrm{down}_{LsRs}\cdot \mathrm{scale}_{LsRs})\cdot SR + (\mathrm{front}\cdot b\cdot \mathrm{scale}_C)\cdot FC$$

As previously described, although a single downmix module can be used, a two-module implementation can increase the number of options available, such as by including an additional downmix opportunity, and including additional control of signal levels of various signals. For example, as the coefficient front 804 is increased, the overall gain of the front left (FL' 812) and front right (FR' 814) channels can be independently controlled by adjusting the coefficient $\mathrm{scale}_{LR}$ 714 (FIG. 11). In one embodiment, the coefficient $\mathrm{scale}_{LR}$ 714 is decreased proportionally to the increasing coefficient front 804 and the total gain of the front left (FL' 812) and the front right (FR' 814) channels remains constant as the fader control 670 (FIG. 9) is operated in the forward fading region 672.

The output for the surround left channel (SL' 818) according to the signal mixer 800 can be represented as follows:

$$SL' = \mathrm{rear}(e\cdot L' + f\cdot C' + g\cdot Ls') = (\mathrm{rear}\cdot e\cdot L') + (\mathrm{rear}\cdot f\cdot C') + (\mathrm{rear}\cdot g\cdot Ls')$$

Substituting L', C', and Ls' from the downmix module 700 of FIG. 11 yields the following:

$$SL' = \mathrm{rear}\cdot e(\mathrm{scale}_{LR}\cdot FL + \mathrm{down}_{LsRs}\cdot Ls' + \mathrm{down}_C\cdot C') + \mathrm{rear}\cdot f\cdot \mathrm{scale}_C\cdot FC + \mathrm{rear}\cdot g\cdot \mathrm{scale}_{LsRs}\cdot SL = (\mathrm{rear}\cdot e\cdot \mathrm{scale}_{LR})\cdot FL + (\mathrm{rear}\cdot e\cdot \mathrm{down}_{LsRs}\cdot \mathrm{scale}_{LsRs} + \mathrm{rear}\cdot g\cdot \mathrm{scale}_{LsRs})\cdot SL + (\mathrm{rear}\cdot e\cdot \mathrm{down}_C\cdot \mathrm{scale}_C + \mathrm{rear}\cdot f\cdot \mathrm{scale}_C)\cdot FC$$

Similarly, the output for the surround right channel (SR' 820) according to the signal mixer 800 can be represented as follows:

$$SR' = \mathrm{rear}(e\cdot R' + f\cdot C' + g\cdot Rs') = (\mathrm{rear}\cdot e\cdot R') + (\mathrm{rear}\cdot f\cdot C') + (\mathrm{rear}\cdot g\cdot Rs')$$

Substituting R', C', and Rs' from the downmix module 700 of FIG. 11 yields the following:

$$SR' = \mathrm{rear}\cdot e(\mathrm{scale}_{LR} FR + \mathrm{down}_{LsRs}\cdot Rs' + \mathrm{down}_C\cdot C') + \mathrm{rear}\cdot f\cdot \mathrm{scale}_C FC + \mathrm{rear}\cdot g\cdot \mathrm{scale}_{LsRs}\cdot SR = (\mathrm{rear}\cdot e\cdot \mathrm{scale}_{LR})\cdot FR + (\mathrm{rear}\cdot e\cdot \mathrm{down}_{LsRs}\cdot \mathrm{scale}_{LsRs} + \mathrm{rear}\cdot g\cdot \mathrm{scale}_{LsRs})\cdot SR + (\mathrm{rear}\cdot e\cdot \mathrm{down}_C\cdot \mathrm{scale}_C + \mathrm{rear}\cdot f\cdot \mathrm{scale}_C)\cdot FC$$

In the pure fading region 676 of FIG. 9, a pure fading function is applied and the downmix module is effectively bypassed. This can be achieved by setting the coefficients as follows:

$$\mathrm{scale}_C = \mathrm{scale}_{LR} = \mathrm{scale}_{LsRs} \neq 0$$

$$\mathrm{down}_C = 0$$

$$\mathrm{down}_{LsRs} = 0$$

This yields surround left (SL' 818) and surround right signals (SR' 820) without the downmix module deliberately preserving center channel content as follows:

$$SL' = (\mathrm{rear}\cdot e\cdot \mathrm{scale}_{LR})\cdot FL + (\mathrm{rear}\cdot g\cdot \mathrm{scale}_{LsRs})\cdot SL + (\mathrm{rear}\cdot f\cdot \mathrm{scale}_C)\cdot FC$$

$$SR' = (\mathrm{rear}\cdot e\cdot \mathrm{scale}_{LR})\cdot FR + (\mathrm{rear}\cdot g\cdot \mathrm{scale}_{LsRs})\cdot SR + (\mathrm{rear}\cdot f\cdot \mathrm{scale}_C)\cdot FC$$

Thus, in the pure fading region 676, center channel signal content is not deliberately preserved when fading backward. By design of the signal mixer 800 (FIG. 13), at least a portion of the front left and the front right signal contents are downmixed with the surround signal channels. However, the front left and the front right signal contents can be dropped by setting the coefficient e to zero. In one embodiment, center channel signal content is also downmixed with the surround left and the surround right signals by setting $\text{down}_C \neq 0$.

In the rear-fading region 674 of FIG. 9, the signals are faded and downmixing occurs to preserve center channel signal content. The preservation of the center channel signal content is accomplished by setting the coefficient $\text{down}_C$ to a non-zero value. This yields surround left and surround right signals with preserved center channel signal content as follows:

$$\text{scale}_{LR}=\text{scale}_{LsRs=scaleC}\neq 0$$

$$\text{down}_C\neq 0$$

$$\text{down}_{LsRs}=0$$

$$SL'=(\text{rear}\cdot e\cdot \text{scale}_{LR})\cdot FL+(\text{rear}\cdot g\cdot \text{scale}_{LsRs})\cdot SL+(\text{rear}\cdot e\cdot \text{down}_C \text{scale}_C+\text{rear}\cdot f\cdot \text{scale}_C)\cdot FC$$

$$SR'=(\text{rear}\cdot e\cdot \text{scale}_{LR})\cdot FR+(\text{rear}\cdot g\cdot \text{scale}_{LsRs})\cdot SR+(\text{rear}\cdot e\cdot \text{down}_C \text{scale}_C+\text{rear}\cdot f\cdot \text{scale}_C)\cdot FC$$

As previously described, although a single downmix module can be used, a two-module implementation can increase the number of options available, such as by including an additional downmix opportunity, and including additional control of signal levels of various signals. For example, as the coefficient rear 806 is increased, the overall gain of the front left (FL') and front right (FR') channels can be independently controlled by adjusting the coefficient $\text{scale}_{LR}$ 714 (FIG. 11). In one embodiment, the coefficient $\text{scale}_{LR}$ 714 is decreased proportionally to the increasing coefficient rear 806 and the total gain of the surround left (SL') and the surround right (SR') channels remains constant as the fader control 670 (FIG. 8) is operated in the rear fading region 674.

FIG. 14 is a signal processor 850 having signal coefficients for various channels in a surround sound system that can be used with the downmix module 700 of FIG. 11. Unlike the signal mixer 800 of FIG. 13, the signal processor 850 does not include signal mixing. The signal processor 850 is shown in a table format to better illustrate its operation. There are numerous analog and digital circuit designs that can be used to implement the signal processor 850. In one embodiment, the signal processor 850 is positioned after the downmix module 700 of FIG. 11. However, it should be noted that the signal processor 850 could be positioned before the downmix module 700 or can be integrated with the downmix module 700 in a single module implementation.

The signal processor 850 includes columns corresponding to the output of the front left channel L' 702, the output of the front right channel R' 704, the output of the front center channel C' 706, the output of the left surround channel $L_s$' 708, and the output of the right surround channel $R_s$' 710 of the downmix module 700. Each of the columns includes various coefficients that can be applied to the signals. The fade column 852 includes optional coefficients indicated as front 854 and rear 856 that can also be applied to the signals depending on the particular fading region. The coefficients front 854 and rear 856 can vary with position of the fade control. For example, the coefficient front 854 can increase and the coefficient rear 856 can decrease as the fader control is faded forward.

The signal processor 850 includes rows corresponding to the outputs of the signal processor 850. The front left output is indicated by FL' 862, the front right output is indicated by FR' 864, the front center output is indicated by FC' 866, the surround left output is indicated by SL' 868, and the surround right output is indicated by SR' 870. An optional back center output is indicated by BC' 872.

The output for the front left channel (FL' 862) according to the signal processor 850 can be represented as follows:

$$FL'=\text{front}(a\cdot L')$$

Substituting L' from the downmix module 700 of FIG. 11 yields the following:

$$FL'=\text{front}\cdot a\cdot(\text{scale}_{LR}\cdot FL+\text{down}_{LsRs}\cdot Ls'+\text{down}_C\cdot C')=(\text{front}\cdot a\cdot \text{scale}_{LR})\cdot FL+(\text{front}\cdot a\cdot \text{down}_{LsRs}\cdot \text{scale}_{LsRs})\cdot SL+(\text{front}\cdot a\cdot \text{down}_C+\text{scale}_C)\cdot FC$$

Similarly, the output for the front right channel (FR' 864) according to the signal processor 850 can be represented as follows:

$$FR'=\text{front}(a\cdot R')$$

Substituting R' and C' from the downmix module 700 of FIG. 11 yields the following:

$$FR'=\text{front}\cdot a\cdot(\text{scale}_{FR}\cdot FR+\text{down}_{LsRs}\cdot Rs'+\text{down}_C\cdot C')=(\text{front}\cdot a\cdot \text{scale}_{LR})\cdot FR+(\text{front}\cdot a\cdot \text{down}_{LsRs}\cdot \text{scale}_{LsRs})\cdot SR+(\text{front}\cdot a\cdot \text{down}_C+\text{scale}_C)\cdot FC$$

In the pure fading region 676 of FIG. 9, a pure fading function is applied and the downmix module 700 is effectively bypassed. This can be achieved by setting the coefficients as follows:

$$\text{scale}_{LR}=\text{scale}_{LsRs}=\text{scale}_C\neq 0$$

$$\text{down}_C=0$$

$$\text{down}_{LsRs}=0$$

This yields front left and front right signals without preserving surround content as follows:

$$FL'=(\text{front}\cdot a\cdot \text{scale}_{LR})\cdot FL$$

$$FR'=(\text{front}\cdot a\cdot \text{scale}_{LR})\cdot FR$$

Thus, in the pure fading region 676, surround signal content is not preserved when fading forward.

In the front fading region 672 of FIG. 9, the signals are faded and downmixing occurs to preserve surround signal content. Since front center channel content is generally present in the forward fade position, the coefficient $\text{down}_C$ can be set to zero. However, the coefficient $\text{down}_C$ can be set to non-zero values if desired. The preservation of the surround signal content is accomplished by setting the coefficient $\text{down}_{LsRs}$ to a non-zero value. This yields front left (FL' 862) and front right signals (FR' 864) with preserved surround signal content as follows:

$$\text{scale}_{LR}=\text{scale}_{LsRs}=\text{scale}_C\neq 0$$

$$\text{down}_C=0$$

$$\text{down}_{LsRs}\neq 0$$

$$FL'=(\text{front}\cdot a\cdot \text{scale}_{LR})\cdot FL+(\text{front}\cdot a\cdot \text{down}_{LsRs}\cdot \text{scale}_{LsRs})\cdot SL$$

$$FR'=(\text{front}\cdot a\cdot \text{scale}_{LR})\cdot FR+(\text{front}\cdot a\cdot \text{down}_{LsRs}\cdot \text{scale}_{LsRs})\cdot SR$$

The output for the surround left channel (SL' 868) according to the signal processor 850 can be represented as follows:

$$SL'=\text{rear}(g\cdot Ls')$$

Substituting Ls' 708 from the downmix module 700 of FIG. 11 yields the following:

$$SL'=\text{rear}\cdot g\cdot \text{scale}_{LsRs}\cdot SL$$

Similarly, the output for the surround right channel (SR' 870) according to the signal mixer 800 can be represented as follows:

$$SR'=\text{rear}(g\cdot Rs')$$

Substituting Rs' from the downmix module 700 of FIG. 11 yields the following:

$$SR'=\text{rear}\cdot g\cdot \text{scale}_{LsRs}\cdot SR$$

In this embodiment, the downmix module 700 of FIG. 11 is not intended to preserve center channel content in the rear fading region 674 of FIG. 9. In another embodiment (not shown), the downmix module could be designed to preserve center channel content in the rear fading region 674. In the embodiment shown, the fader control 670 of FIG. 8 performs a pure fading function in the rear fading region 674. Additionally, as previously described, a pure fading function is applied in the pure fading region 676 of FIG. 9.

A number of embodiments of the invention have been described. Nevertheless, it will be understood that various modifications may be made. For example, although the systems and techniques are described primarily in the context of automotive listening environments, the systems and techniques are also applicable in other listening environments. In addition, although certain examples of control parameters are described, the systems and techniques may be used in connection with other control parameters that use two or more control regions to apply different control functions for each control region.

It is evident that those skilled in the art may now make numerous modifications and uses of the specific apparatus and techniques herein described without departing from the inventive concepts. Consequently, the invention is to be construed as embracing each and every novel feature and novel combination of features present in or possessed by the apparatus and techniques disclosed herein and limited only by the spirit and slope of the appended claims.

The invention claimed is:

1. A method for preserving an audio signal in an audio system having at least a front transducer and a rear transducer and receiving a plurality of audio signals including a front and a surround audio signal, the method comprising:
- applying the surround audio signal to the rear transducer with a first amount of gain;
- mixing a portion of the surround audio signal with the front audio signal from the plurality of audio signals to generate a mixed front audio signal;
- applying the mixed front audio signal to the front transducer with a second amount of gain; and
- decreasing the first amount of gain and increasing the second amount of gain according to a fade contour,
- wherein the fade contour keeps total sound energy due to reproduction of the audio signals by the transducers constant by:
  - providing an amount for the decrease of the first amount of gain, the decrease causing a decrease in total sound energy due to reproduction of the surround audio signal by the rear transducer, and, at the same time,

- providing an amount for the increase of the second amount of gain, the increase causing an increase in total sound energy due to reproduction of the mixed front audio signal by the front transducer,
  - the increase in total sound energy offsetting the decrease in total sound energy.

2. The method of claim 1 wherein the fade contour is generated based on a polynomial approximating the fade contour, the polynomial having coefficients determined by performing calculations during operation of the audio system.

3. The method of claim 1 further comprising modifying a gain of the front audio signal prior to mixing the portion of the surround audio signal with the front audio signal.

4. An audio system having at least a front transducer and a rear transducer and receiving a plurality of audio signals including a front and a surround audio signal, the audio system further comprising:
- a processor configured to:
- apply the surround audio signal to the rear transducer with a first amount of gain;
- mix a portion of the surround audio signal with front audio signal to generate a mixed front audio signal;
- apply the mixed front audio signal to the front transducer with a second amount of gain;
- decrease the first amount of gain and
- increase the second amount of gain according to a fade contour,
- wherein the fade contour keeps total sound energy due to reproduction of the audio signals by the transducers constant by:
  - providing an amount for the decrease of the first amount of gain, the decrease causing a decrease in total sound energy due to reproduction of the surround audio signal by the rear transducer, and, at the same time,
  - providing an amount for the increase of the second amount of gain, the increase causing an increase in total sound energy due to reproduction of the mixed front audio signal by the front transducer,
- the increase in total sound energy offsetting the decrease in total sound energy.

5. An audio system having at least a front transducer and a rear transducer and receiving a plurality of audio signals including a front and a surround audio signal, the audio system further comprising:
- a memory storing a table of gain values; and
- a processor configured to:
- apply the surround audio signal to the rear transducer with a first amount of gain;
- mix a portion of the surround audio signal with front audio signal to generate a mixed front audio signal;
- apply the mixed front audio signal to the front transducer with a second amount of gain;
- retrieve from the memory an amount of increase in the second amount of gain and an amount of decrease in the first amount of gain according to a fade contour,
  - wherein the fade contour keeps total sound energy due to reproduction of the audio signals by the transducers constant by providing an amount for the decrease of the first amount of gain, the decrease causing a decrease in total sound energy due to reproduction of the surround audio signal by the rear transducer, and, at the same time, providing an amount for the increase of the second amount of gain, the increase causing an increase in total sound energy due to reproduction of the mixed front audio signal by the front transducer, the increase in total sound energy offsetting the decrease in total sound energy;

decrease the first amount of gain by the retrieved amount of decrease; and increase the second amount of gain by the retrieved amount of increase.

6. The method of claim 1 wherein the fade contour is generated from a lookup table containing information relating gain values to a ratio of a level of the surround audio signal to a level of the front audio signal.

7. The method of claim 2 wherein the polynomial coefficients are calculated using a least squares fit model.

* * * * *